(12) United States Patent
Whetsel

(10) Patent No.: US 7,157,939 B2
(45) Date of Patent: Jan. 2, 2007

(54) QUAD STATE MEMORY WITH CONVERTER FEEDBACK, TRANSMISSION, AND CLOCK CIRCUITRY

(75) Inventor: Lee D. Whetsel, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/103,782

(22) Filed: Apr. 11, 2005

(65) Prior Publication Data

US 2005/0179462 A1    Aug. 18, 2005

Related U.S. Application Data

(62) Division of application No. 10/618,920, filed on Jul. 14, 2003, now Pat. No. 6,963,225, which is a division of application No. 09/767,318, filed on Jan. 22, 2001, now Pat. No. 6,636,076.

(51) Int. Cl.
*H03K 19/00* (2006.01)

(52) U.S. Cl. .......................................... 326/59; 326/60
(58) Field of Classification Search ............ 326/59–60; 365/168, 154, 233
See application file for complete search history.

(56) References Cited

U.S. PATENT DOCUMENTS 5,872,813 A * 2/1999 Hui ............................. 375/286
6,133,754 A * 10/2000 Olson ........................... 326/59

* cited by examiner

*Primary Examiner*—Anh Q. Tran
(74) *Attorney, Agent, or Firm*—Lawrence J. Bassuk; W. James Brady; Frederick J. Telecky, Jr.

(57) ABSTRACT

Quad-state logic elements and quad-state memory elements are used to reduce the wiring density of integrated circuits. The resulting reduction in wiring interconnects between memories and logic elements results in higher speed, higher density, and lower power integrated circuit designs.

3 Claims, 24 Drawing Sheets

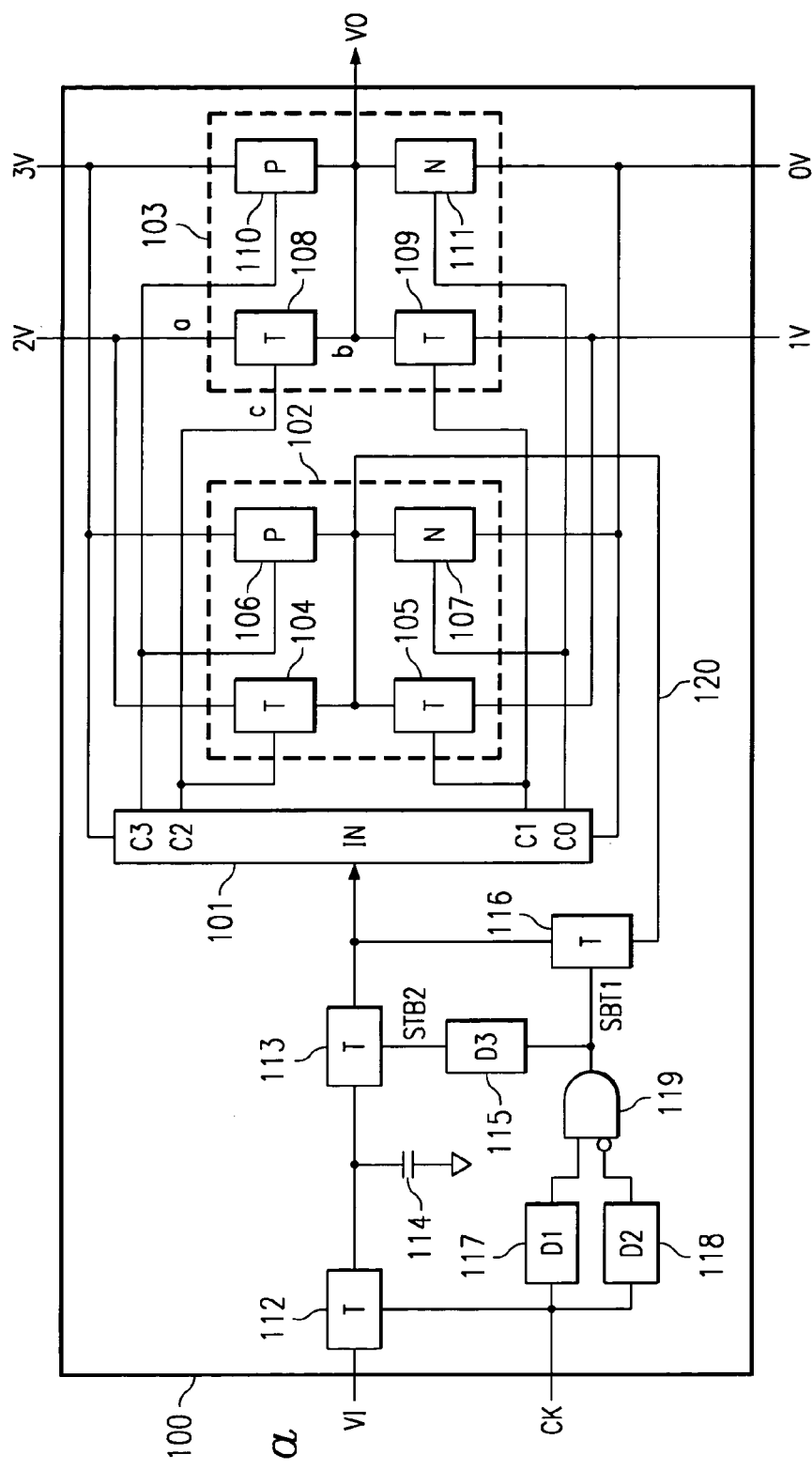

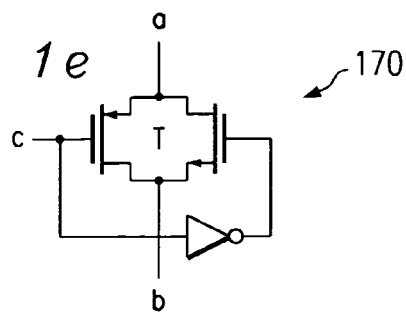
FIG. 1d
| VI/VO | B:A |
|---|---|
| 0 | L:L |
| 1 | L:H |
| 2 | H:L |
| 3 | H:H |
161
FIG. 1e
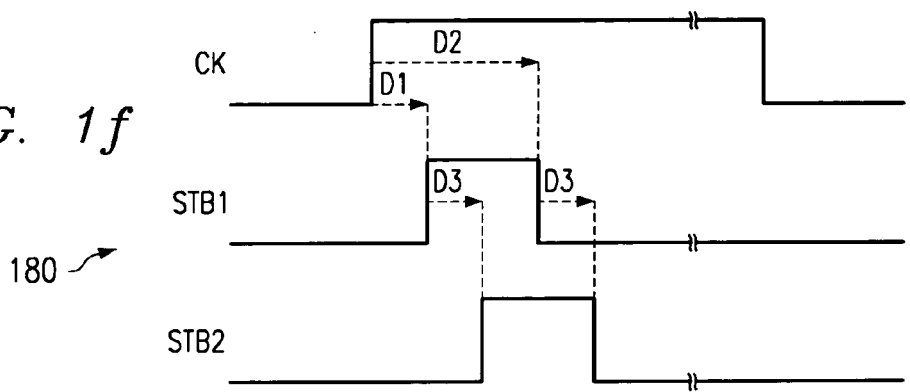
FIG. 1f
180
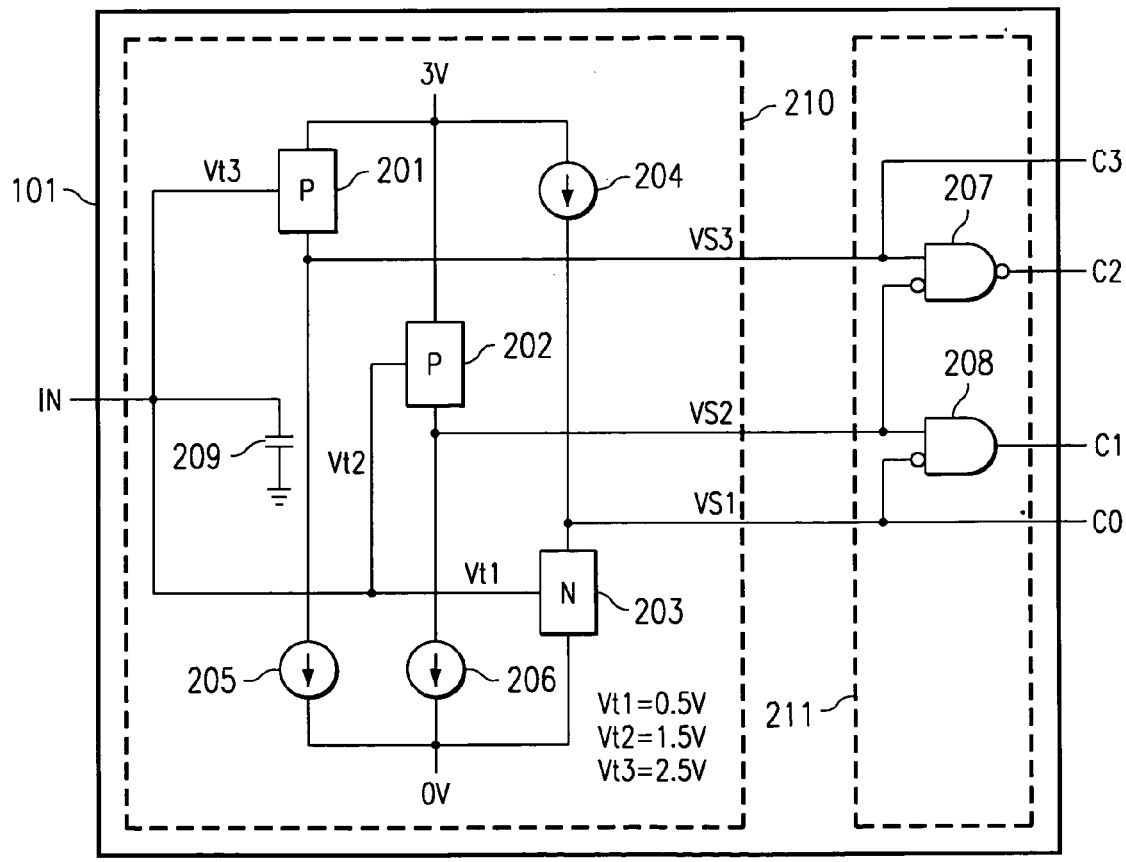
FIG. 2a

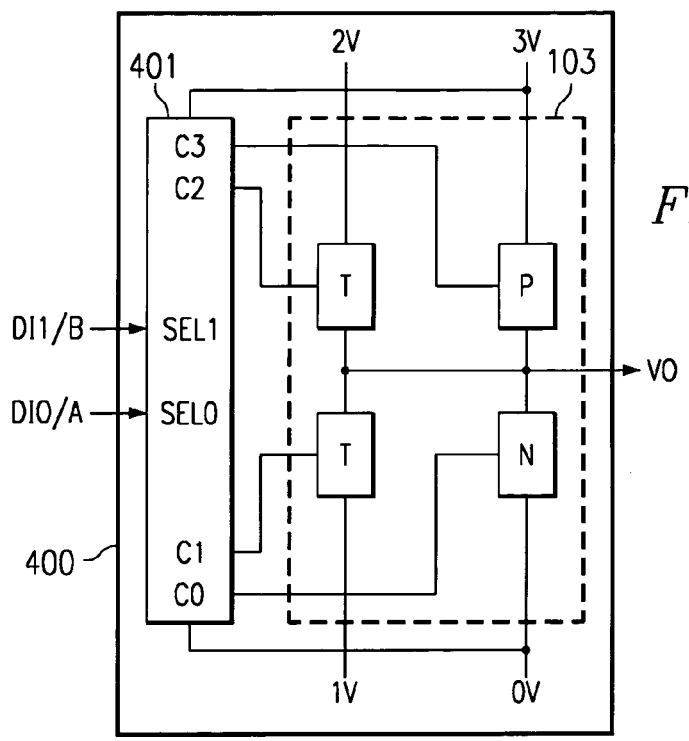
*FIG. 4a*
| DI1/B:DI0/A | C0 | C1 | C2 | C3 | VO |
|---|---|---|---|---|---|
| L : L | H | L | H | H | 0 |
| L : H | L | H | H | H | 1 |
| H : L | L | L | L | H | 2 |
| H : H | L | L | H | L | 3 |
*FIG. 4b*
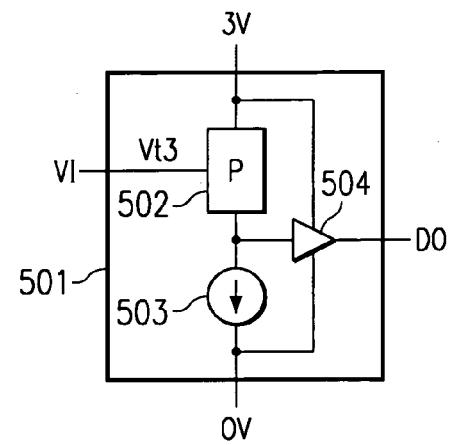
*FIG. 5a*
| $DO = \overline{B \cdot A}$ | |
|---|---|
| VI | DO |
| 0 | H |
| 1 | H |
| 2 | H |
| 3 | L |
*FIG. 5b*
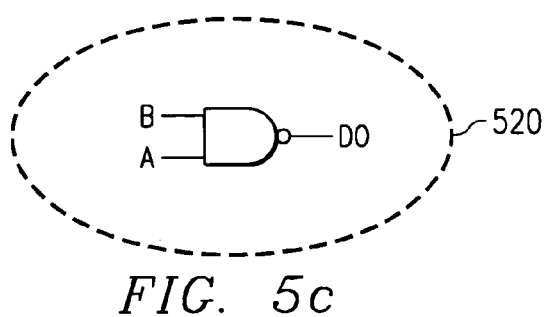
*FIG. 5c*

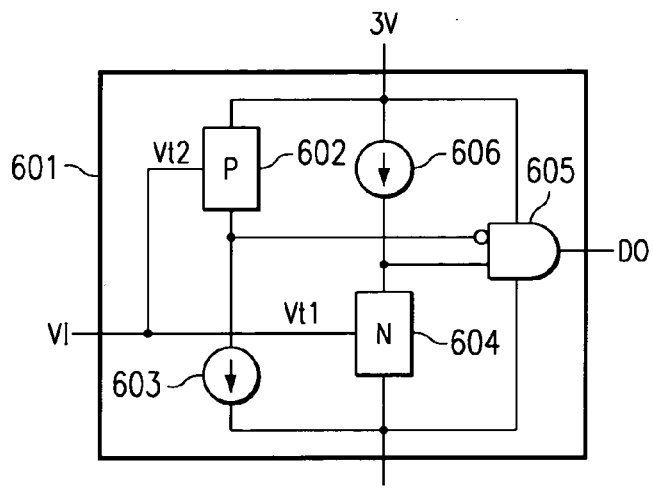
FIG. 6a
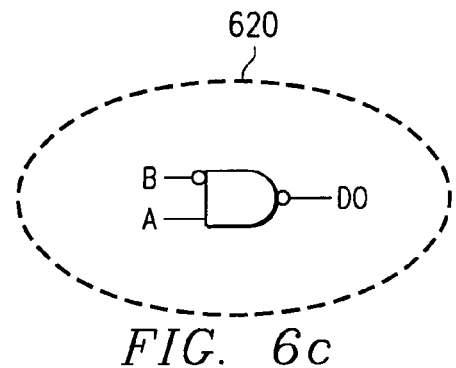
FIG. 6b
FIG. 6c
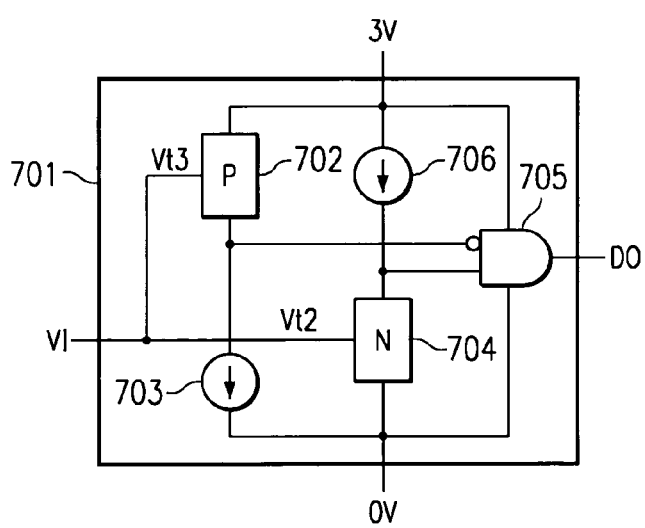
FIG. 7a
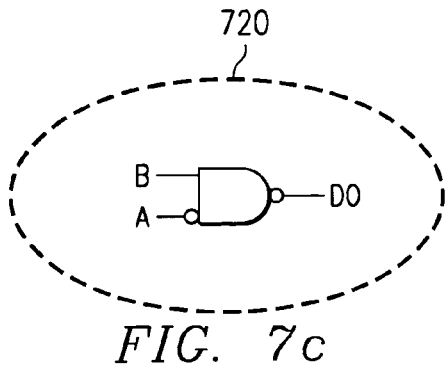
FIG. 7b
FIG. 7c

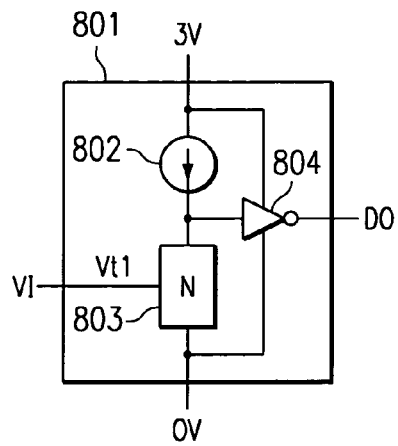
FIG. 8a
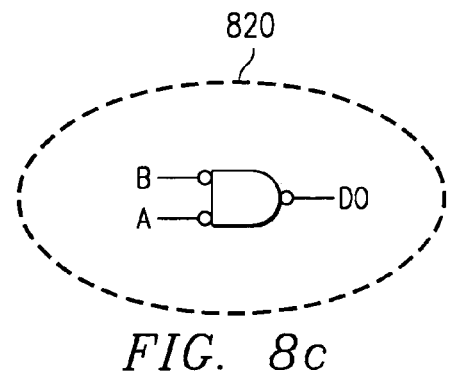
FIG. 8b
FIG. 8c
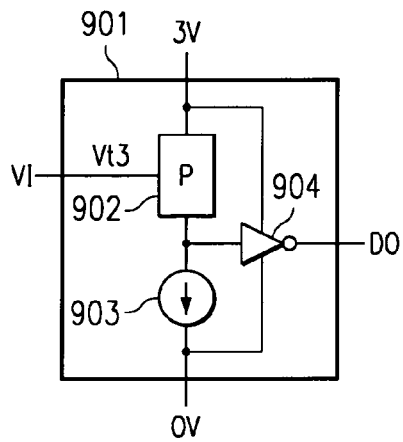
FIG. 9a
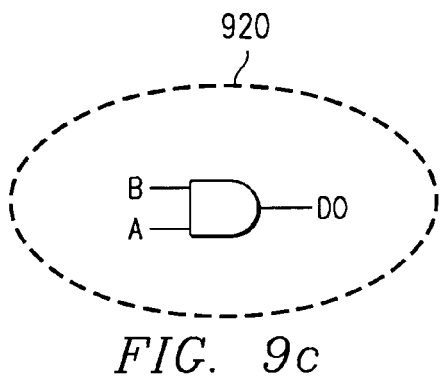
FIG. 9b
FIG. 9c
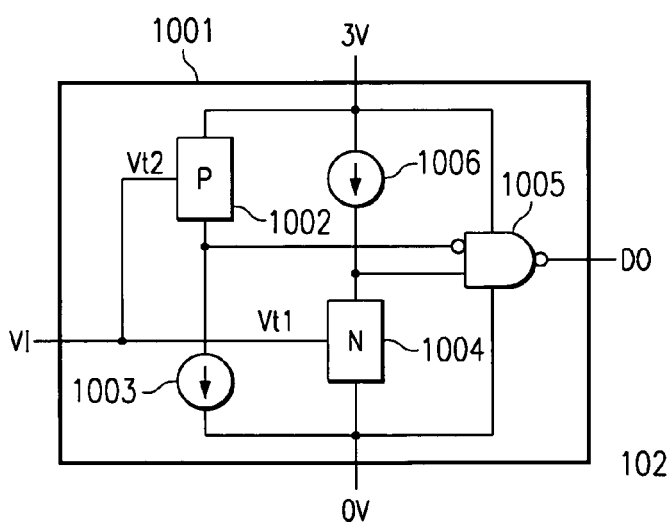
FIG. 10a
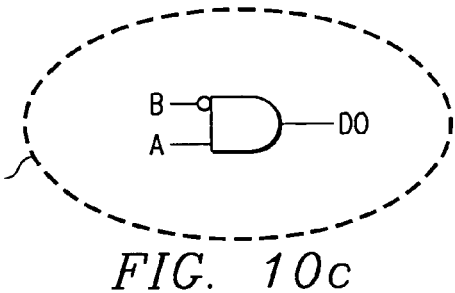
FIG. 10b
FIG. 10c

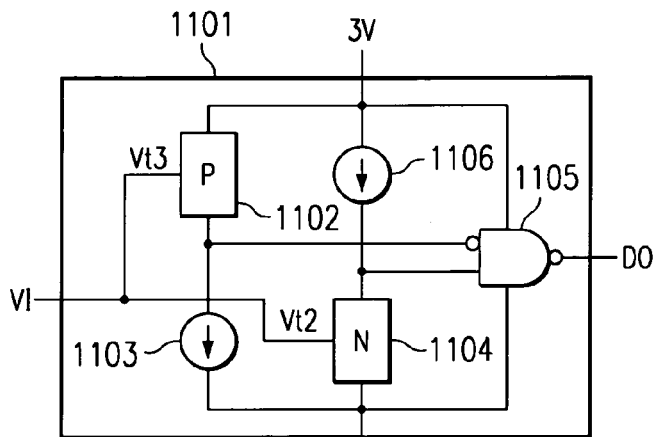
FIG. 11a
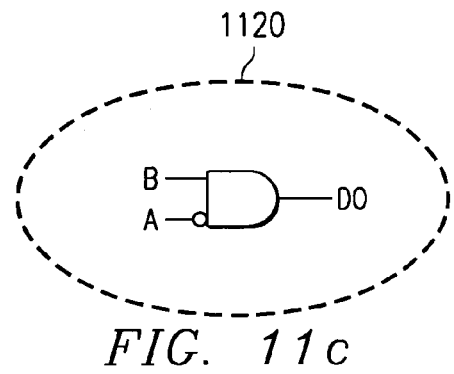
FIG. 11b
FIG. 11c
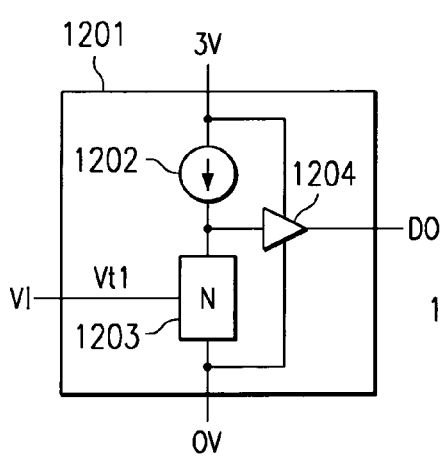
FIG. 12a
FIG. 12b
FIG. 12c
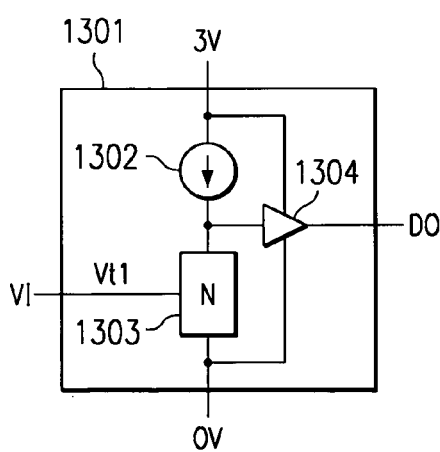
FIG. 13a
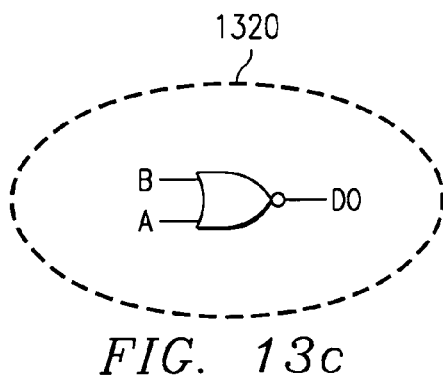
FIG. 13b
FIG. 13c

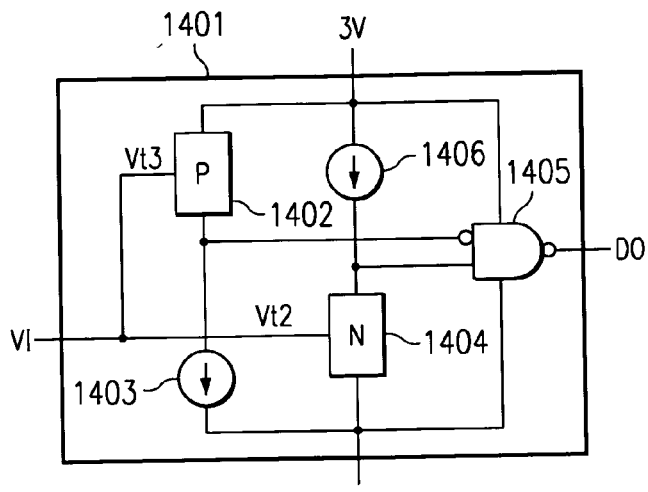
FIG. 14a
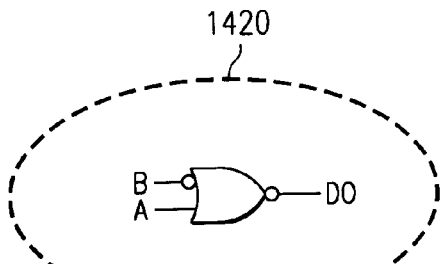
FIG. 14b
FIG. 14c
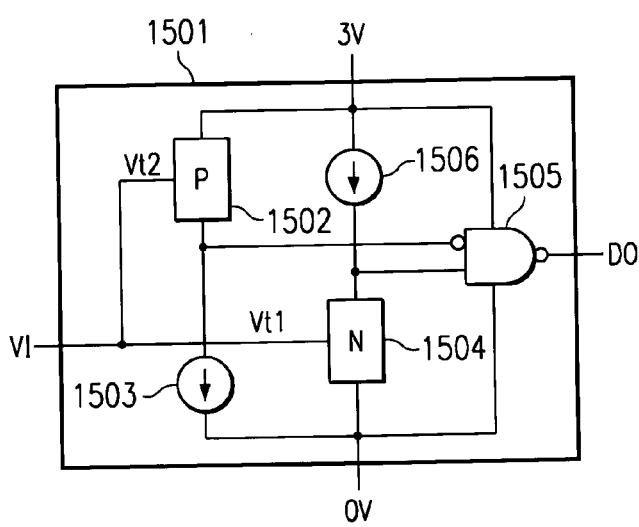
FIG. 15a
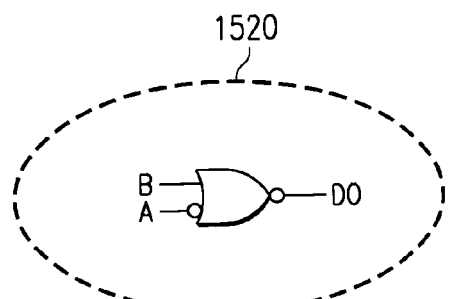
FIG. 15b
FIG. 15c

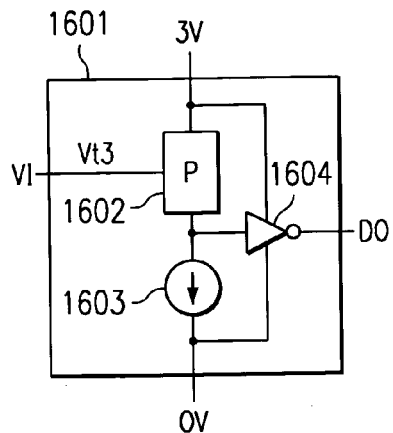
*FIG. 16a*
*FIG. 16b*
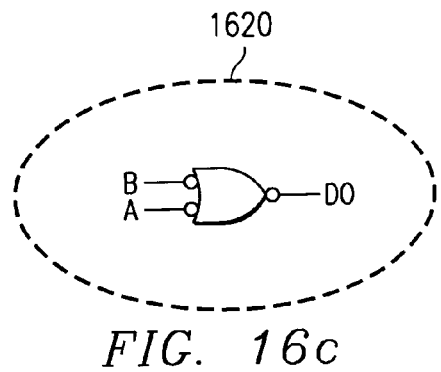
*FIG. 16c*
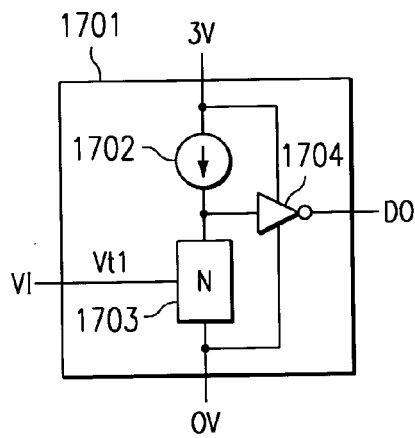
*FIG. 17a*
*FIG. 17b*
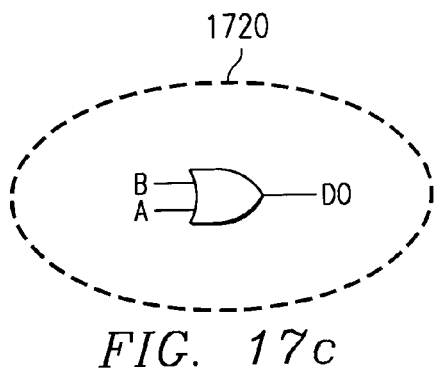
*FIG. 17c*
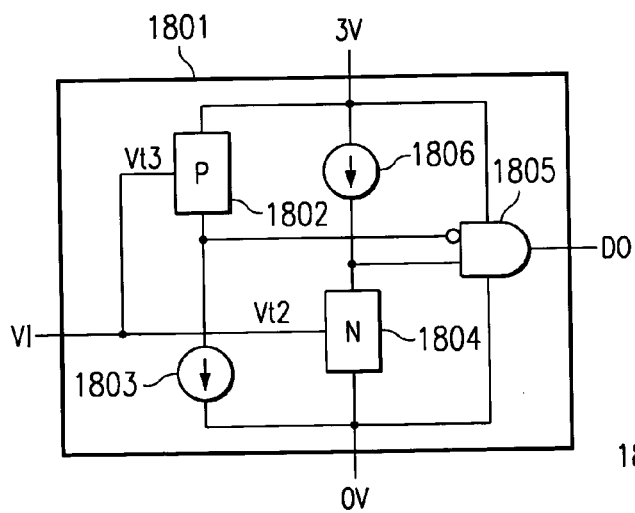
*FIG. 18a*
*FIG. 18b*
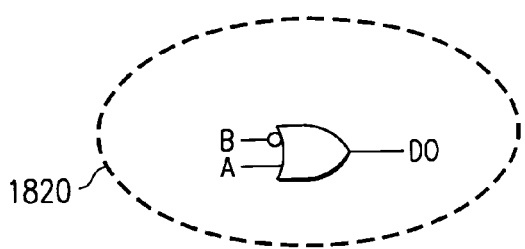
*FIG. 18c*

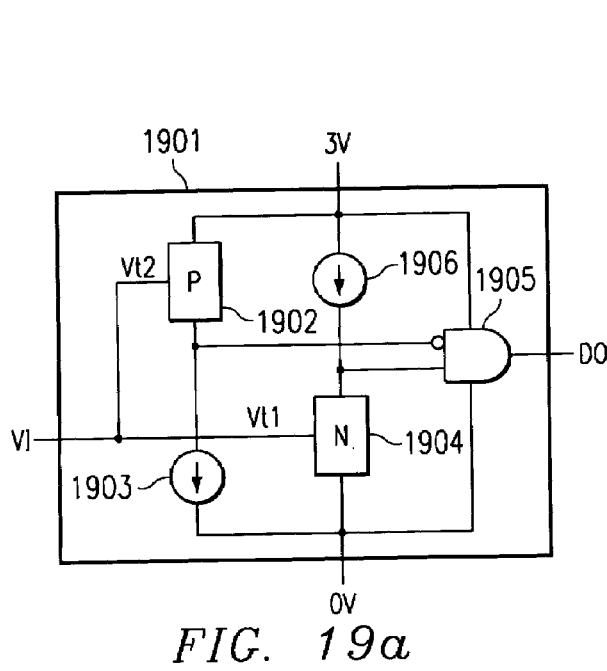
FIG. 19a
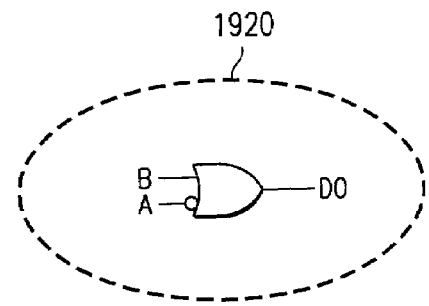
FIG. 19b
FIG. 19c
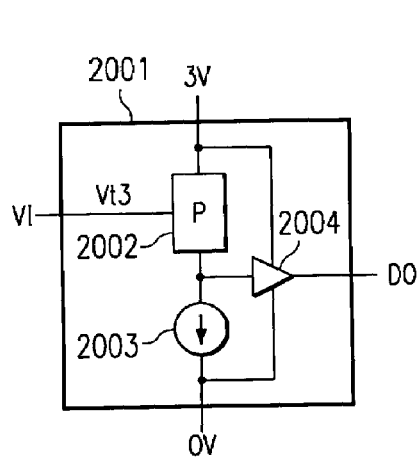
FIG. 20a
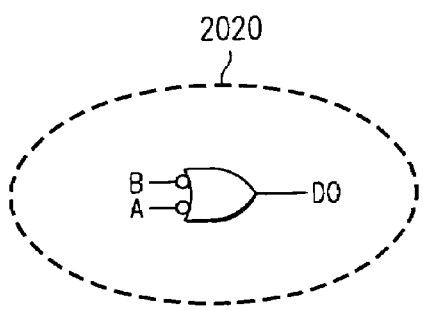
FIG. 20b
FIG. 20c

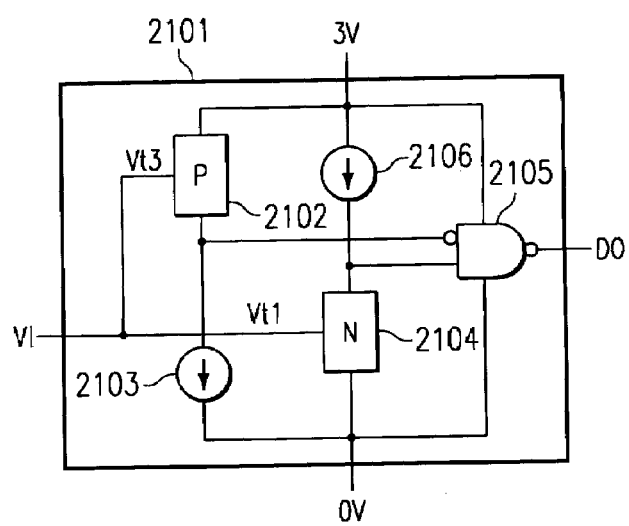
FIG. 21a
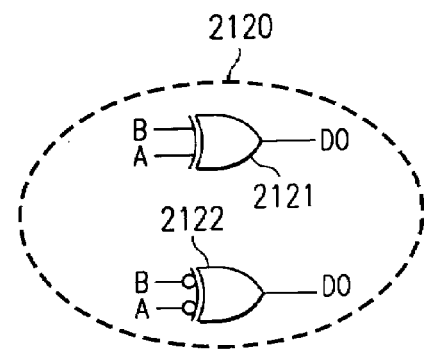
FIG. 21b
FIG. 21c
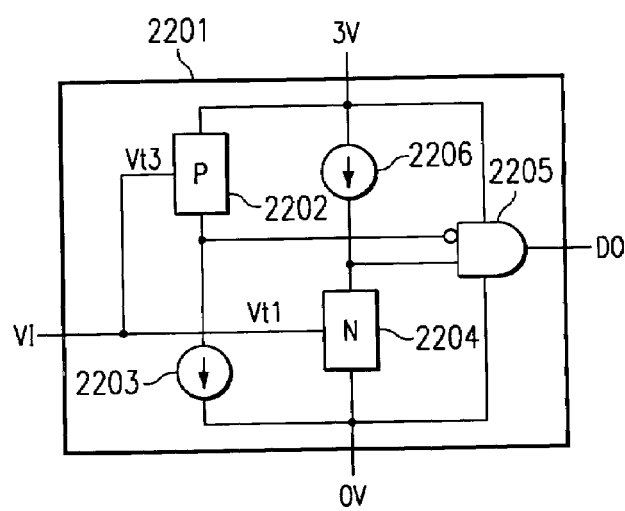
FIG. 22a
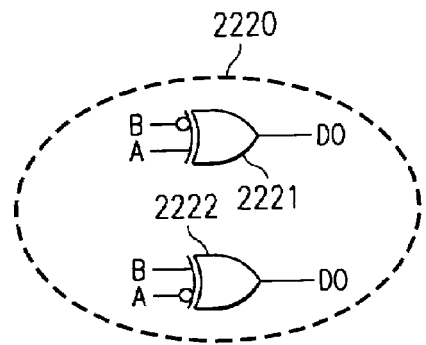
FIG. 22b
FIG. 22c $$DO = \overline{(B1*A1)+(B0*A0)}$$
VI1(B1:A1), VI0(B0:A0)
| VI1 | VI0 | DO |
|---|---|---|
| 0(L:L) | 0(L:L) | H |
| 0(L:L) | 1(L:H) | H |
| 0(L:L) | 2(H:L) | H |
| 0(L:L) | 3(H:H) | L |
| 1(L:H) | 0(L:L) | H |
| 1(L:H) | 1(L:H) | H |
| 1(L:H) | 2(H:L) | H |
| 1(L:H) | 3(H:H) | L |
| 2(H:L) | 0(L:L) | H |
| 2(H:L) | 1(L:H) | H |
| 2(H:L) | 2(H:L) | H |
| 2(H:L) | 3(H:H) | L |
| 3(H:H) | 0(L:L) | L |
| 3(H:H) | 1(L:H) | L |
| 3(H:H) | 2(H:L) | L |
| 3(H:H) | 3(H:H) | L |
*FIG. 25e*
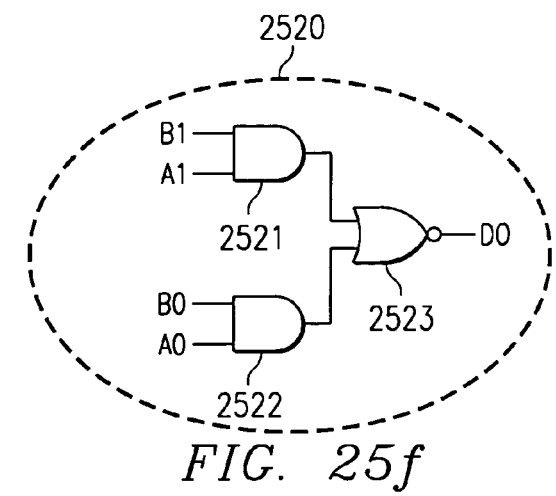
*FIG. 25f*
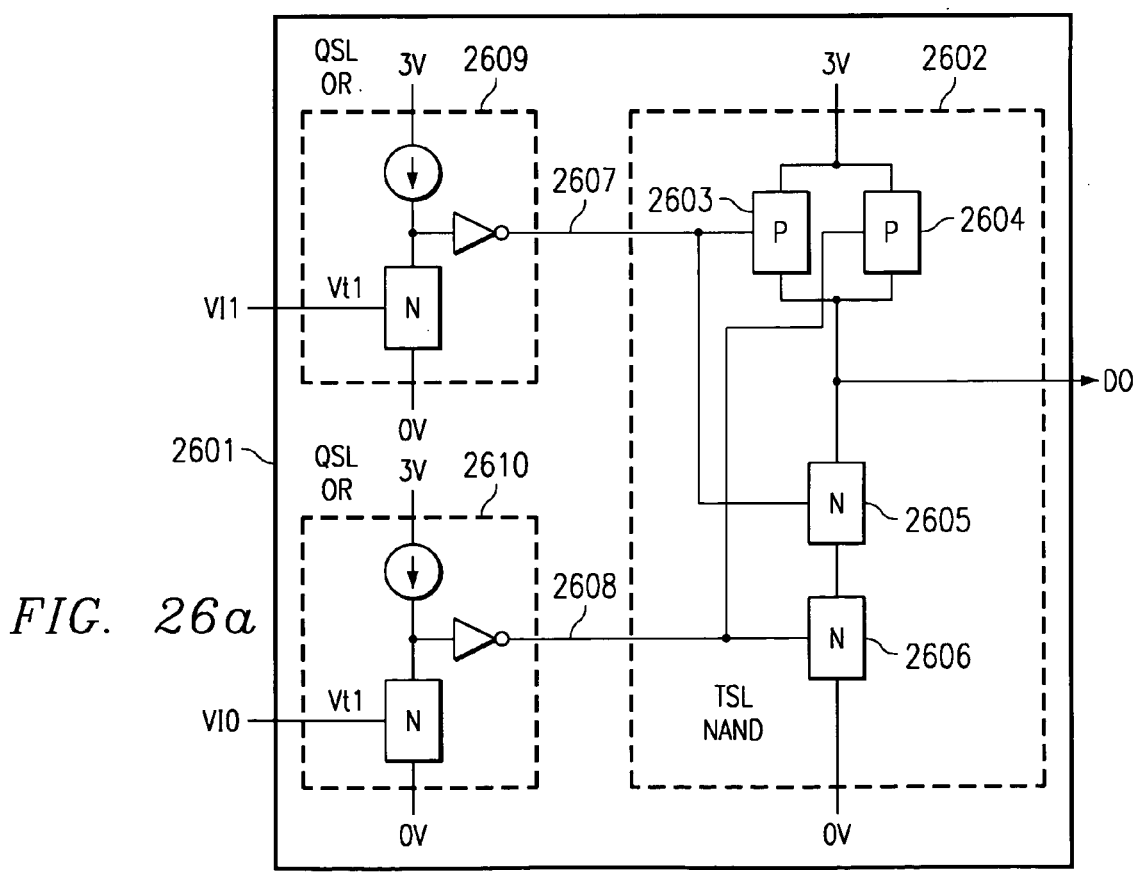
*FIG. 26a*

| VI1 | B1:A1 |
|---|---|
| 0 | L:L |
| 1 | L:H |
| 2 | H:L |
| 3 | H:H |

2630

| VI0 | B0:A0 |
|---|---|
| 0 | L:L |
| 1 | L:H |
| 2 | H:L |
| 3 | H:H |

2631

DO=B+A

| VI | DO |
|---|---|
| 0 | L |
| 1 | H |
| 2 | H |
| 3 | H |

1710

$DO = \overline{(B1+A1)(B0+A0)}$
VI1(B1:A1), VI0(B0:A0)

| VI1 | VI0 | DO |
|---|---|---|
| 0(L:L) | 0(L:L) | H |
| 0(L:L) | 1(L:H) | H |
| 0(L:L) | 2(H:L) | H |
| 0(L:L) | 3(H:H) | H |
| 1(L:H) | 0(L:L) | H |
| 1(L:H) | 1(L:H) | L |
| 1(L:H) | 2(H:L) | L |
| 1(L:H) | 3(H:H) | L |
| 2(H:L) | 0(L:L) | H |
| 2(H:L) | 1(L:H) | L |
| 2(H:L) | 2(H:L) | L |
| 2(H:L) | 3(H:H) | L |
| 3(H:H) | 0(L:L) | H |
| 3(H:H) | 1(L:H) | L |
| 3(H:H) | 2(H:L) | L |
| 3(H:H) | 3(H:H) | L |

2640

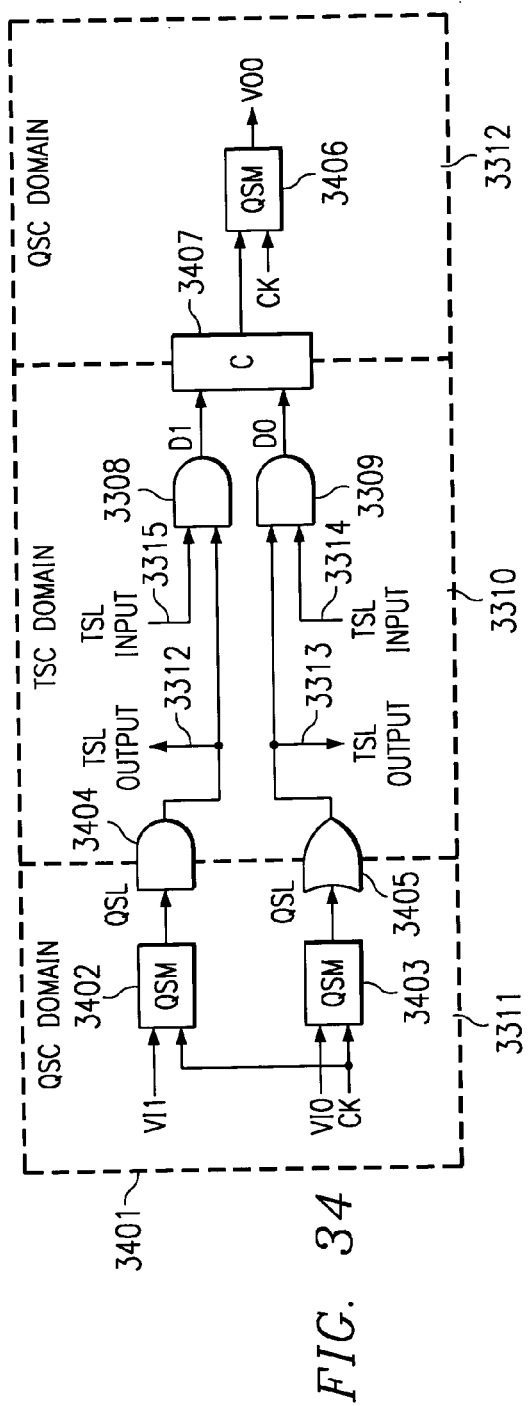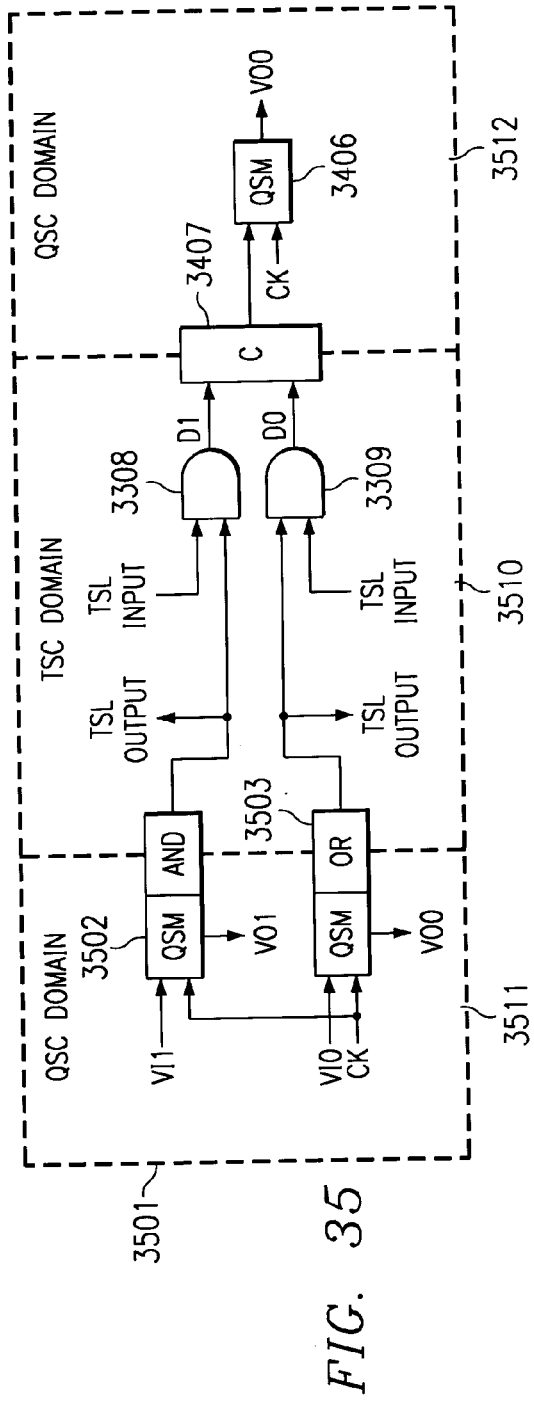
FIG. 34
FIG. 35

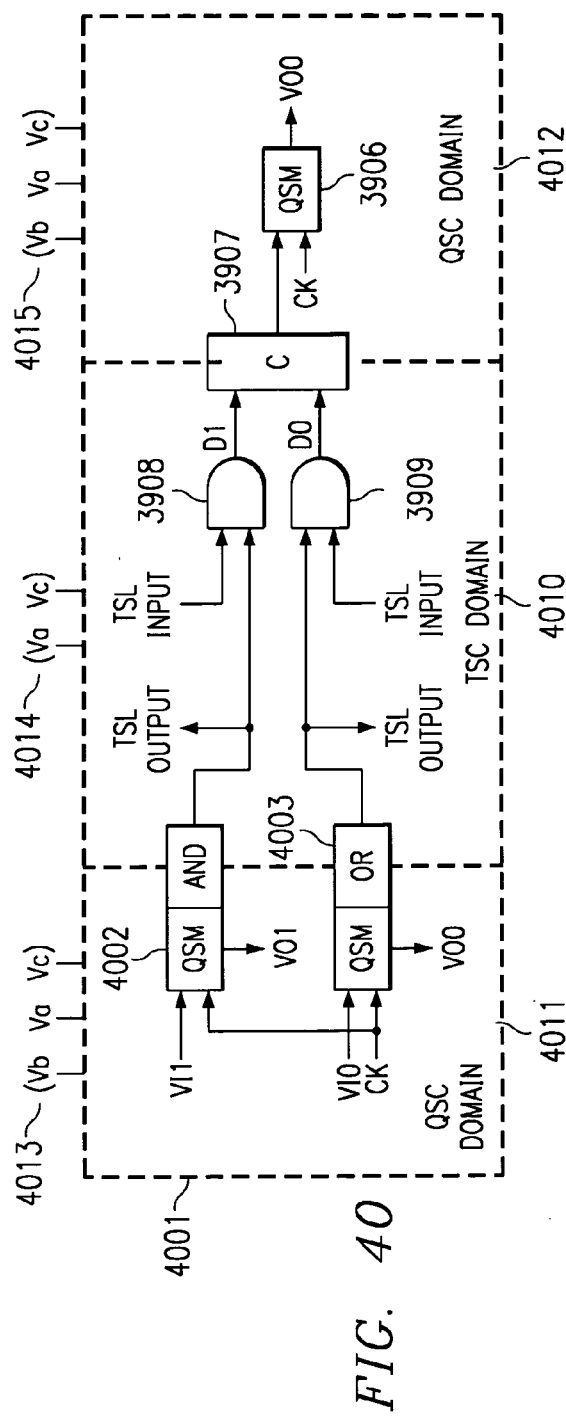
FIG. 40
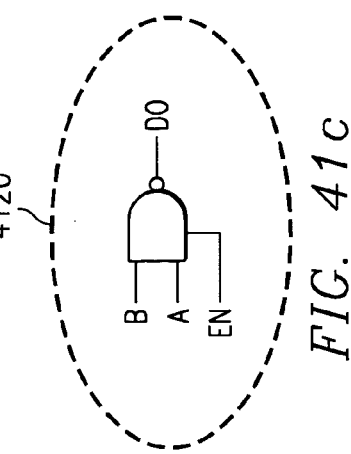
FIG. 41c
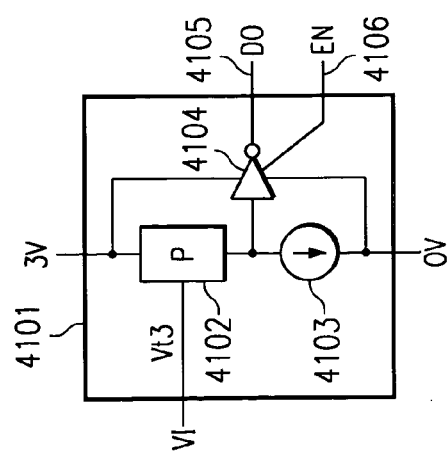
FIG. 41b
FIG. 41a

US 7,157,939 B2

QUAD STATE MEMORY WITH CONVERTER FEEDBACK, TRANSMISSION, AND CLOCK CIRCUITRY

CROSS-REFERENCE TO RELATED APPLICATIONS

This application is a divisional of application Ser. No. 10/618,920, filed Jul. 14, 2003, now U.S. Pat. No. 6,963,225, issued Nov. 8, 2005, which was a divisional of application Ser. No. 09/767,318, filed Jan. 22, 2001, now U.S. Pat. No. 6,636,076, which claims priority under 35 USC 119(e)(1) of provisional application Ser. No. 60/171,039, filed Dec. 16, 1999.

BACKGROUND OF THE INVENTION

Digital portions of integrated circuit designs consist generally of memories (i.e. flip flops/latches) for storing one of two logic states and connected gates (i.e. Boolean logic) for performing logical operations on the logic states stored in the memories. An N input logic gate may receive input from N memories via N separate wires. Moore's Law predicts that the number of transistors per square inch on integrated circuits doubles each 18 months. Thus, potentially the number of wires between memories and logic gates may double each 18 months. As the density of integrated circuits tracks Moore's Law, the wiring within integrated circuit emerges as a serious obstacle to the advancement of semiconductors. Also, as the number of signaling wires increase, power consumption of integrated circuits, related to charging and discharging of wiring capacitance, also increases and emerges as another serious obstacle to the advancement of semiconductors.

SUMMARY OF THE INVENTION

The present invention provides novel quad-state logic elements for use with quad-state memory elements to reduce the wiring density of integrated circuits. The present invention, among other features described herein, advantageously provides reduced wiring interconnects between memories and logic elements, resulting in higher speed, higher density, and lower power integrated circuit designs.

BRIEF DESCRIPTION OF THE DRAWINGS

FIG. 1a illustrates a quad state memory according to the present invention.

FIG. 1b illustrates a conventional D flip flop pair.

FIG. 1c is a voltage to state convention table for use by the present invention.

FIG. 1d is a truth table illustrating the operation of the quad state memory of FIG. 1a.

FIG. 1e illustrates a T-gate used in FIG. 1a.

FIG. 1f is a timing diagram showing the clocking scheme of the quad state memory of FIG. 1a.

FIG. 2a illustrates a circuit implementation of the voltage to state converter of FIG. 1a.

FIG. 2b is a truth table illustrating the operation of the voltage to state converter of FIG. 2a.

FIG. 3a illustrates a quad-state to two-state decompressor gate.

FIG. 3b is a truth table illustrating the operation of the quad-state to two-state decompressor gate of FIG. 3a.

FIG. 4a illustrates a two-state to quad-state compressor gate.

FIG. 4b is a truth table illustrating the operation of the two-state to quad-state compressor gate of FIG. 4a.

FIG. 5a illustrates a quad-state logic NAND gate according to the present invention.

FIG. 5b is a truth table illustrating the operation of the quad-state logic NAND gate of FIG. 5a.

FIG. 5c illustrates a conventional two-state logic NAND gate.

FIG. 6a illustrates a quad-state logic NAND gate according to the present invention.

FIG. 6b is a truth table illustrating the operation of the quad-state logic NAND gate of FIG. 6a.

FIG. 6c illustrates a conventional two-state logic NAND gate.

FIG. 7a illustrates a quad-state logic NAND gate according to the present invention.

FIG. 7b is a truth table illustrating the operation of the quad-state logic NAND gate of FIG. 7a.

FIG. 7c illustrates a conventional two-state logic NAND gate.

FIG. 8a illustrates a quad-state logic NAND gate according to the present invention.

FIG. 8b is a truth table illustrating the operation of the quad-state logic NAND gate of FIG. 8a.

FIG. 8c illustrates a conventional two-state logic NAND gate.

FIG. 9a illustrates a quad-state logic AND gate according to the present invention.

FIG. 9b is a truth table illustrating the operation of the quad-state logic AND gate of FIG. 9a.

FIG. 9c illustrates a conventional two-state logic AND gate.

FIG. 10a illustrates a quad-state logic AND gate according to the present invention.

FIG. 10b is a truth table illustrating the operation of the quad-state logic AND gate of FIG. 10a.

FIG. 10c illustrates a conventional two-state logic AND gate.

FIG. 11a illustrates a quad-state logic AND gate according to the present invention.

FIG. 11b is a truth table illustrating the operation of the quad-state logic AND gate of FIG. 11a.

FIG. 11c illustrates a conventional two-state logic AND gate.

FIG. 12a illustrates a quad-state logic AND gate according to the present invention.

FIG. 12b is a truth table illustrating the operation of the quad-state logic AND gate of FIG. 12a.

FIG. 12c illustrates a conventional two-state logic AND gate.

FIG. 13a illustrates a quad-state logic NOR gate according to the present invention.

FIG. 13b is a truth table illustrating the operation of the quad-state logic NOR gate of FIG. 13a.

FIG. 13c illustrates a conventional two-state logic NOR gate.

FIG. 14a illustrates a quad-state logic NOR gate according to the present invention.

FIG. 14b is a truth table illustrating the operation of the quad-state logic NOR gate of FIG. 14a.

FIG. 14c illustrates a conventional two-state logic NOR gate.

FIG. 15a illustrates a quad-state logic NOR gate according to the present invention.

FIG. 15b is a truth table illustrating the operation of the quad-state logic NOR gate of FIG. 15a.

FIG. 15c illustrates a conventional two-state logic NOR gate.

FIG. 16a illustrates a quad-state logic NOR gate according to the present invention.

FIG. 16b is a truth table illustrating the operation of the quad-state logic NOR gate of FIG. 16a.

FIG. 16c illustrates a conventional two-state logic NOR gate.

FIG. 17a illustrates a quad-state logic OR gate according to the present invention.

FIG. 17b is a truth table illustrating the operation of the quad-state logic OR gate of FIG. 17a.

FIG. 17c illustrates a conventional two-state logic OR gate.

FIG. 18a illustrates a quad-state logic OR gate according to the present invention.

FIG. 18b is a truth table illustrating the operation of the quad-state logic OR gate of FIG. 18a.

FIG. 18c illustrates a conventional two-state logic OR gate.

FIG. 19a illustrates a quad-state logic OR gate according to the present invention.

FIG. 19b is a truth table illustrating the operation of the quad-state logic OR gate of FIG. 19a.

FIG. 19c illustrates a conventional two-state logic OR gate.

FIG. 20a illustrates a quad-state logic OR gate according to the present invention.

FIG. 20b is a truth table illustrating the operation of the quad-state logic OR gate of FIG. 20a.

FIG. 20c illustrates a conventional two-state logic-OR gate.

FIG. 21a illustrates a quad-state logic XOR gate according to the present invention.

FIG. 21b is a truth table illustrating the operation of the quad-state logic XOR gate of FIG. 21a.

FIG. 21c illustrates a conventional two-state logic XOR gate.

FIG. 22a illustrates a quad-state logic XOR gate according to the present invention.

FIG. 22b is a truth table illustrating the operation of the quad-state logic XOR gate of FIG. 22a.

FIG. 22c illustrates a conventional two-state logic XOR gate.

FIG. 25a illustrates a quad-state logic AND-OR-INVERT circuit according to the present invention.

FIGS. 25b–25e are truth tables illustrating the operation of the quad-state logic AND-OR-INVERT circuit of FIG. 25a.

FIG. 25f illustrates a conventional AND-OR-INVERT circuit.

FIG. 26a illustrates a quad-state logic OR-AND-INVERT circuit according to the present invention.

FIGS. 26b–26e are truth tables illustrating the operation of the quad-state logic OR-AND-INVERT circuit of FIG. 26a.

FIG. 26f illustrates a conventional OR-AND-INVERT circuit.

FIG. 30 illustrates a circuit using the quad-state memory circuits of FIG. 29.

FIG. 34 illustrates a hybrid circuit according to the present invention using two-state circuit domains and quad-state circuit domains.

FIG. 35 illustrates a modification of the circuit of FIG. 34.

FIG. 40 illustrates a hybrid circuit according to another embodiment of the present invention.

FIG. 41a illustrates a 3-state output quad-state logic NAND gate.

FIG. 41b is a truth table illustrating the operation of the quad-state logic NAND gate of FIG. 41a.

FIG. 41c illustrates a conventional 3-state output two-state logic NAND gate.

DETAILED DESCRIPTION OF THE INVENTION

Figures 2B, 3A, 3B:
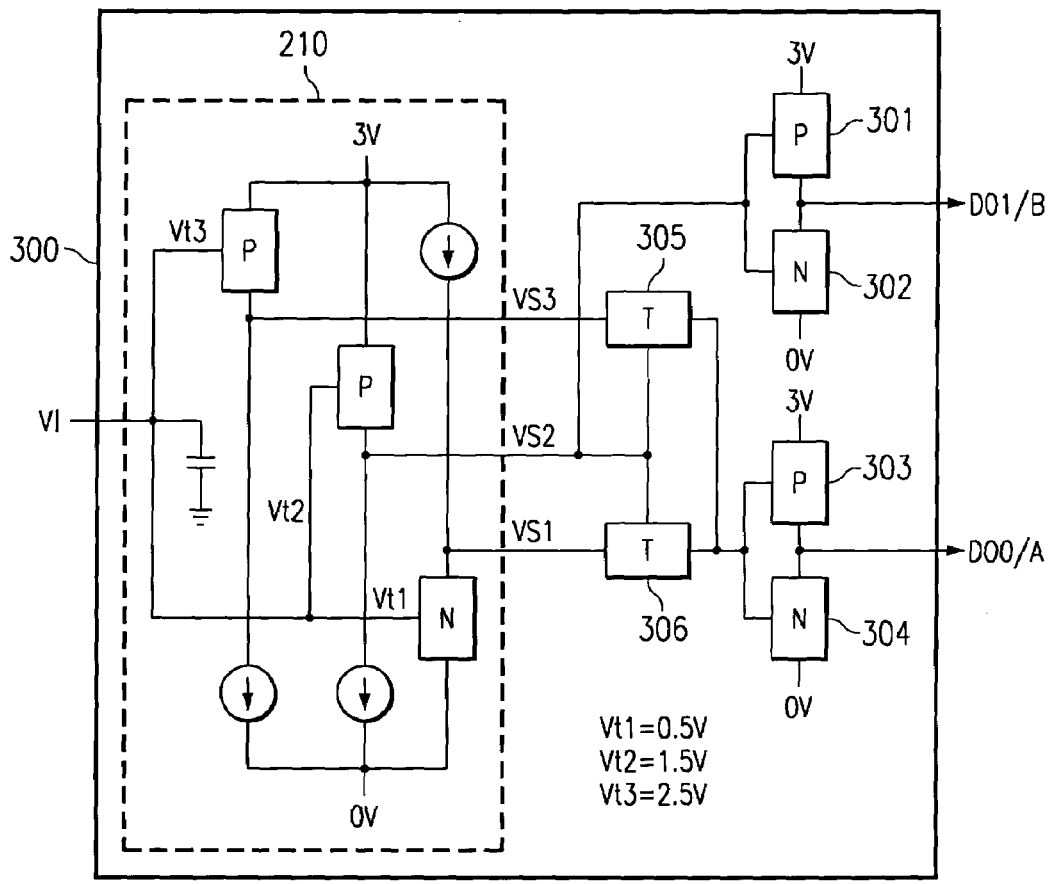

FIG. 1 illustrates an example circuit implementation of the quad state memory (QSM) 100 of the present invention. QSM 100 includes a voltage input (VI), a voltage output (VO), and a clock (CK) input. QSM 100 is connected to voltage supplies of 0V, 1V, 2V, and 3V. Internally QSM 100 consists of a voltage to state converter 101, state feedback circuit 102, state output circuit 103, clock circuitry 117, 118, 119, 115, 116, VI transmission gates (T-gates) 112, 113, and 116, and VI holding capacitor 114. One lead of capacitor 114 is connected to the node between T-gates 112 and 113 and the other lead of capacitor 114 is connected to ground, which is equal to the 0V supply.

QSM 100 duplicates the memory functionality of the conventional D flip flop pair 140. While various types of D flip flops could be illustrated in 140, i.e. two phase level sensitive flip flops and single phase edge triggered flip flops, edge triggered types are shown. The VI input of QSM 100 is encoded by four voltage levels to represent all possible Ai and Bi input combinations to the D flip flop pair 140. The VO output of QSM 100 is encoded by four voltage levels to represent all possible Ao and Bo output combinations from D flip flop pair 140. The voltage to state convention table 161, to be used by the present invention, indicates that; (1) 0 volts on VI/VO encodes to Bi/o=Low and Ai/o=Low, (2) 1 volt on VI/VO encodes to Bi/o=Low and Ai/o=High, (3) 2 volts on VI/VO encodes to Bi/o=High and Ai/o=Low, and (4) 3 volts on VI/VO encode to Bi/o=High and Ai/o=High. It should be clear that other voltage to state conventions could be used as well. From inspection, it is clear that QSM 100 requires one encoded data input (VI) as opposed to two conventional data inputs (Ai and Bi) for D flip flop pair 140, and QSM 100 requires one encoded data output (VO) as opposed to two conventional data outputs (Ao and Bo) for D flip flop 140. Thus QSM 100 has a 2 to 1 input and a 2 to 1 output wiring reduction advantage over the D flip flop pair 140.

Voltage to state converter 101 serves to input a voltage from T-gate 113 or 116 and output a state representation of the input voltage to state feedback circuit 102 and state output circuit 103, via the C0–3 outputs. Voltage to state converter 101 enables only one of the C0–3 outputs to be active at any one time. C0 is connected to the gate inputs of N-channel transistors 107 and 111 of 102 and 103, respectively. C1 is connected to the gate inputs of T-gates 105 and 109 of 102 and 103, respectively. C2 is connected to the gate inputs of T-gates 104 and 108 of 102 and 103, respectively. C3 is connected to the gate inputs of P-channel transistors 106 and 110 of 102 and 103, respectively.

State feedback circuit 102; (1) outputs 0V to T-gate 116 on feedback path 120 when C0 is active, (2) outputs 1V to T-gate 116 on feedback path 120 when C1 is active, (3) outputs 2V to T-gate 116 on feedback path 120 when C2 is active, and (4) outputs 3V to T-gate 116 on feedback path 120 when C3 is active. State output circuit 103; (1) outputs 0V on VO when C0 is active, (2) outputs 1V on VO when C1 is active, (3) outputs 2V on VO when C2 is active, and (4) outputs 3V on VO when C3 is active. Both state feedback circuit 102 and state output circuit 103 respond identically to the C0–3 outputs from voltage to state converter circuit 101. State feedback circuit 102 is provided as a separate circuit from state output circuit 103 to provide a feedback signal which is isolated from noise that might be present on the VO output of the state output circuit 103. The transistors 108–111 of the state output circuit 103 are designed to provide adequate VO drive capability, whereas the transistors of state feedback circuit 102 are designed to provide only the drive needed to maintain the feedback voltage state being output from voltage to state converter 101.

In both the state feedback circuit 102 and state output circuit 103, (1) P-channel transistors 106 and 10 are used to provide switching of the 3V supply to feedback path 120 and VO respectively, (2) N-channel transistors 107 and 111 are used to provide the switching of the 0V supply to the feedback path 120 and VO respectively, (3) P and N channel transmission gates 104 and 108 are used to provide the switching of the 2V supply to the feedback path 120 and VO respectively, and (4) P and N channel T-gates 105 and 109 are used to provide the switching of the 1V supply to the feedback path 120 and VO respectively. T-gates 104, 105, 108, 109 are preferred as switches over single P and N channel transistors since they provide better bi-directional, low on resistance switching properties for VO and feedback path 120 signals that switch between 2V and one of either 0V, 1V, or 3V for 104 and 108, and between 1V and one of either 0V, 2V, or 3V for 105 and 109. Example T-gate 170 shows that it includes both a P and N channel transistor path between its "a" and "b" terminals. When an off condition is input to the T-gate both transistors are gated off When an on condition is input to the T-gate, both transistors are gated on, providing the above mentioned bi-directional, low on resistance switching property.

QSM truth table 160 indicates the operation of the QSM. When no clock pulse (P) is present, the voltage on VI is a don't care and the voltage on VO remains in its present state. The encoded B:A representation of a VO remaining in its present state is indicated by "-:- ". When a clock pulse occurs, the voltage on VI is transmitted to VO, via the voltage to state converter 101, where it is maintained following the clock pulse by the feedback path 120.

The timing diagram 180 provides the detail clocking scheme of the QSM. When the clock is low, T-gates 112 and 116 are on and T-gate 113 is off. While clock is low, capacitor 114 charges or discharges to the voltage level of VI via T-gate 112. While clock is low, T-gate 116 is on to allow the voltage output from feedback circuit 102 to provide input to the voltage to state converter 101. This feedback connection 120 between feedback circuit 102 and voltage to state converter circuit 101 forms the memory latching mechanism of the QSM. When the clock transitions high, T-gates 112 and 116 turn off and T-gate 113 turns on. With T-gate 113 on, the voltage on capacitor 114 is allowed to drive the input of the voltage to state converter. In response to the voltage input from T-gate 113, the voltage to state converter 101 adjusts its C0–3 outputs to cause the feedback path 120 of state feedback circuit 102 and the VO of state output circuit 103 to output a voltage equivalent to the voltage being input to the voltage to state converter 101. When the clock transitions low, T-gates 112 and 116 turn on and T-gate 113 turns off. With T-gate 116 on, the new voltage output from state feedback circuit 102 is the sole input to the voltage to state converter and serves to maintain the present C0–3 state outputs of the voltage to state converter 101. The state output circuit 103 is thus controlled by the latched C0–3 outputs to maintain the new VO output from the QSM. The above described action takes place during each new clock pulse input to allow the QSM to input and store a new quad-state output voltage at VO.

During the low to high clock transition, delay 1 (D1) and delay 2 (D2) circuits 117 and 118 are used at the input of AND gate 119 to produce a temporary strobe (STB 1) output from the And gate to T-gate 116, as seen in the timing diagram 180. Delay 3 (D3) circuit 115 is used to produce another temporary strobe (STB2) between the And gate and T-gate 113. These delay circuits insure a proper turn on and turn off sequence of the T-gates during each clock pulse. The sequence starts when the clock initially goes high, which turns T-gate 112 off. After the D1 circuit delay, STB1 goes high to turn off T-gate 116 and open the feedback path 120. After the D3 circuit delay, STB2 goes high to turn on T-gate 113 to input the VI voltage stored in capacitor 114. In response to the VI voltage, the state converter 101 outputs new C0–3 states to the state feedback circuit 102 and state output circuit 103 to cause feedback path 120 and VO to go to a voltage level equivalent to the VI voltage level. After the D2 circuit delay, STBI returns low to turn on T-gate 116 to form the feedback path again with the new voltage output from the state feedback circuit 102, which has been set equivalent to VI in capacitor 114 via the C0–3 outputs. After a delay from the D3 circuit, STB2 returns low to turn off T-gate 113, leaving the voltage on the state feedback path 120 as the sole voltage input to the voltage to state converter 101.

Since T-gate 112 is turned off on the rising edge of the clock, the QSM 100 operates as an rising edge sensitive memory with near zero hold time on the VI input with respect to the rising clock edge. Since T-gate 116 is turned off before T-gate 113 is turned on, T-gate 116 does not act as a charge or discharge path for the VI voltage level stored in capacitor 114 when T-gate 113 turns on. During the D1 time delay, where both T-gates 113 and 116 are off, the small intrinsic capacitance at the input node of the voltage to the state converter 101 maintains a stable voltage input until T-gate 113 turns on following the D1 time delay. Capacitor 114 will have sufficient capacity to drive the small intrinsic capacitance of the input node of the voltage to state converter 101 to the VI voltage level stored in capacitor 114.

While this QSM circuit example uses a singe clock and internal circuitry to adapt the single clock into separate strobes-operable to perform the memory storage operation, a QSM with multiple clocks could also have been used to provide the separate control for performing the memory storage operation, as well.

FIG. 2 illustrates an example circuit implementation of the voltage to state converter 101. Voltage to state converter 101 consists of a threshold detection circuit 210 and a C0–3 output decoder 211. The threshold detection circuit 210 serves to input the voltage from T-gate 113 or T-gate 116 and output a three voltage signal representations (VS1–3) of the input voltage. The C0–3 output decoder serves to input the VS1–3 signals, decode the VS1–3 signals into C0–3 outputs. The C0–3 outputs are used to activate a selected one of the transistors in the state feedback circuit 102 and state output circuit 103, as previously described.

Threshold detection circuit 210 consists of, (1) a first path comprising a P-channel transistor 201 with one channel terminal connected to 3V and the other channel terminal connected to 0V through a current source 205, (2) a second path comprising a P-channel transistor 202 with one channel terminal connected to 3V and the other channel terminal connected to 0V through a current source 206, and (3) a third path comprising an N-channel transistor 203 with one channel terminal connected to 0V and the other channel terminal connected to 3V through a current source 204. Current sources 204–206 can be implemented using resistors or transistors. The gate input of each of the transistors are commonly connected to an input (IN) from T-gates. 113 and 116. Capacitor 209 indicates the previously mentioned intrinsic capacitance, which consists of the transistor 201–203 gate and wiring capacitance. The VS1 output signal is connected between current source 204 and transistor 203. The VS2 output signal is connected between transistor 202 and current source 206. The VS3 output signal is connected between transistor 201 and current source 205. Transistor 203 is designed to turn on when its gate voltage threshold (Vt1) is above 0.5 volts, otherwise its off. Transistor 202 is designed to turn off when its gate voltage threshold (Vt2) is above 1.5 volts, otherwise its on. Transistor 201 is designed to turn off when its gate voltage threshold (Vt3) is above 2.5 volts, otherwise its on.

When 0V is input (IN) to the threshold detection circuit 210, transistor 203 is off and VS1 is high, transistor 202 is on and VS2 is high, and transistor 201 is on and VS3 is high. When 1V is input to the threshold detection circuit 210, transistor 203 is on and VS1 is low, transistor 202 is on and VS2 is high, and transistor 201 is on and VS3 is high. When 2V is input to the threshold detection circuit 210, transistor 203 is on and VS1 is low, transistor 202 is off and VS2 is low, and transistor 201 is on and VS3 is high. When 3V is input to the threshold detection circuit 210, transistor 203 is on and VS1 is low, transistor 202 is off and VS2 is low, and transistor 201 is off and VS3 is low.

C0–3 output decoder 211 inputs the VS1–3 signals and decodes them, using the NAND gate 207 and AND gate 208 arrangement shown, into appropriate logic states on C0–3 to control the transistors of the feedback state circuit 102 and output state circuit 103. Truth table 220 indicates this decoding as follows. When 0V is input on IN, the VS1–3 signals are established and input to decoder 211 to set C0=High, C1=Low, C2=High, and C3=High. When 1V is input on IN, the VS1–3 signals are established and input to decoder 211 to set C0=Low, C1=High, C2=High, and C3=High. When 2V is input on IN, the VS1–3 signals are established and input to decoder 211 to set C0=Low, C1=Low, C2=Low, and C3=High. When 3V is input on IN, the VS1–3 signals are established and input to decoder 211 to set C0=Low, C1=Low, C2=High, and C3=Low. While this decoding is used, other decoding are possible, depending on the type of C0–3 control required to regulate the type and arrangement of the transistors in the state feedback circuit 102 and state output circuit 103, or other circuits coupled to the C0–3 control outputs.

From truth table 220 it is seen that the C0–3 output settings control the transistors of the state feedback circuit 102 and state output circuit 103 such that the feedback path 120 and VI are driven to; (1) an encoded B:A=L:L or 0V when IN=0V, (2) an encoded B:A=L:H or 1V when IN=1V, (3) an encoded B:A=H:L or 2V when IN=2V, and (4) an encoded B:A=H:H or 3V when IN=3V. Again, this encoding matches the voltage to state convention of table 161.

Quad-State to Two-State Decompressor Gate

To allow a quad-state circuit, such as QSM 100, to output a quad-state value to a two-state circuit, a circuit for decompressing quad-state values into their equivalent two-state B:A encoded values is required. In FIG. 3, an example circuit of a quad-state to two-state decompressor (D) gate 300 is depicted. D-gate 300 comprises a voltage threshold detecting circuit 210, complementary transistors 301 and 302 forming a two-state data output 1 (DO1)) driver, complementary transistors 303 and 304 forming a two-state data output 0 (DO0) driver, and an interface between the VS1–3 outputs of 210 and gate inputs of the DO1 and DO0 two-state output drivers. In FIG. 3 DO0 and DO1 are labeled DO0/A and DO1/B to indicate the B:A encoding. VS1 connects to a first terminal of T-gate 306 and VS3 connects to a first terminal of T-gate 305. The second terminals of T-gate 305 and 306 are connected together and to the gate inputs of transistors 303 and 304 of the DO0 output driver. VS2 connects to the gate inputs of T-gates 305 and 306 and to the gate inputs of transistors 301 and 302 of the DO1 output driver.

Truth table 320 indicates the operation of the D-gate. When VI is 0V, VS1:VS2:VS3=H:H:H. In this condition, VS2 turns on T-gate 306 and turns off T-gate 305. VS1 is input to the gate inputs of the DO0 output driver, via T-gate 306, to cause DO0 to be Low and VS2 is input to the gates of the DO1 driver to cause DO1 to be Low. When VI is 1V, VS1:VS2:VS3=L:H:H. In this condition, VS2 turns on T-gate 306 and turns off T-gate 305. VS1 is input to the gate inputs of the DO0 output driver, via T-gate 306, to cause DO0 to be high and VS2 is input to the gates of the DO1 driver to cause DO1 to be low. When VI is 3V, VS1:VS2:VS3=L:L:L. In this condition, VS2 turns off T-gate 306 and turns on T-gate 305. VS3 is input to the gate inputs of the DO0 output driver, via T-gate 305, to cause DO0 to be low and VS2 is input to the gates of the DO1 driver to cause DO1 to be High. When VI is 3V, VS1:VS2:VS3=L:L:L. In this condition, VS2 turns off T-gate 306 and turns on T-gate 305. VS3 is input to the gate inputs of the DO0 output driver, via T-gate 305, to cause DO0 to be High and VS2 is input to the gates of the DO1 driver to cause DO1 to be High.

From the above description it is seen that; (1) the D-gate operates to decompress a quad-state B:A encoded 0V value into its DO1:DO0=L:L two-state pair equivalency for input into a two-state circuit, (2) the D-gate operates to decompress a quad-state B:A encoded 1V value into its DO1:DO0=L:H two-state pair equivalency for input into a two-state circuit, (3) the D-gate operates to decompress a quad-state B:A encoded 2V value into its DO1:DO0=H:L two-state pair equivalency for input into a two-state circuit, and (4) the D-gate operates to decompress a quad-state B:A encoded 3V value into its DO1:DO0=H:H two-state pair equivalency for input into a two-state circuit.

Two-State to Quad-State Compressor Gate

To allow a quad-state circuit, such as QSM 100, to input a quad-state value from a two-state circuit, a circuit for compressing a two-state value pair into an equivalent quad-state value is required. In FIG. 4, an example circuit of a two-state to quad-state compressor (C) gate 400 is depicted. C-gate 400 comprises a selector circuit 401 and the state output circuit 103 of FIG. 1. Selector circuit 401 is a simple decoder circuit that inputs data input 0 (DI0) and data input 1 (DI1) signal pairs from a two-state circuit and outputs appropriately decoded C0–3 control signals to the transistors of the state output circuit 103. In FIG. 4 DI0 and DI1 are labeled DI0/A and DI1/B to indicate the B:A encoding.

Truth table 420 indicates the operation of the C-gate. When DI1:DI0=L:L, the C0–3 control signals are set to cause VO of the state output circuit 103 to be equal to 0V. When DI1:DI0=L:H, the C0–3 control signals are set to cause VO of the state output circuit 103 to be equal to 1V. When DI1:DI0=H:L, the C0–3 control signals are set to cause VO of the state output circuit 103 to be equal to 2V. When DI1:DI0=H:H, the C0–3 control signals are set to cause VO of the state output circuit 103 to be equal to 3V.

From the above description it is seen that; (1) the C-gate operates to compress a two-state DI1:DI0=L:L input pair into an equivalent B:A encoded quad-state 0V value for input to a quad-state circuit, (2) the C-gate operates to compress a two-state DI1:DI0=L:H input pair into an equivalent B:A encoded quad-state 1V value for input to a quad-state circuit, (3) the C-gate operates to compress a two-state DI1:DI0=H:L input pair into an equivalent B:A encoded quad-state 2V value for input to a quad-state circuit, and (4) the C-gate operates to compress a two-state DI1:DI0=H:H input pair into an equivalent B:A encoded quad-state 3V value for input to a quad-state circuit.

Quad-State Logic

QSM 100 of FIG. 1 has provided an example of a memory circuit capable of storing B:A encoded quad-state signals. D-gate 300 of FIG. 3 has provided an example of a circuit capable of decompressing B:A encoded quad-state signals into their corresponding two-state signal pair equivalencies: C-gate 400 of FIG. 4 has provided an example of a circuit capable of compressing a pair of two-state signals into their corresponding B:A encoded quad-state signal equivalencies. QSM 100, D-gate 300, and C-gate 400 were subject matter described in the previously mentioned patent specification reference TI-29692PS—Quad State Memory Design Methods, Circuits, and Systems. The remainder of this patent specification will describe quad-state logic (QSL) circuits, associated with QSM 100, D-gate 300, and C-gate 400, that are capable of directly performing Boolean logic operations on B:A encoded quad-state signals.

QSL NAND Gates

FIGS. 5 through 8 illustrate QSL NAND gates designed to input B:A encoded quad-state signals, perform logical NAND operations on the encoded B and A components of the signals, and output two-state logic (TSL) signals representative of the result of the logical NAND operations performed.

In FIG. 5, a QSL NAND gate 501 comprises transistor 502, current source 503, and non-inverting output buffer 504. Transistor 502 and current source 503 form a path between the 3V and 0V supplies. The input to buffer 504 is connected to a node in the path between transistor 502 and current source 503. The gate input of transistor 502 is connected to a VI input and the output of buffer 504 is connected to a DO output. When the voltage on VI is less than the transistor threshold voltage Vt3 (2.5V), transistor 502 is on and current flows in the path, creating a voltage at the buffer 504 input that drives a two-state high output on DO. When the voltage on VI is greater than the transistor threshold voltage Vt3 (2.5V), transistor 502 is off and no current flows in the path, creating a voltage at the buffer 504 input that drives a two-state low output on DO.

Truth table 510 depicts the logical operation of the QSL NAND gate 501. From truth table 510, it is seen that QSL NAND 501 duplicates the logical operation of conventional TSL NAND 520 in that: (1) when VI is 0V (B:A=L:L) DO is high, (2) when VI is 1V (B:A=L:H) DO is high, (3) when VI is 2V (B:A=H:L) DO is high, and (4) when VI is 3V (B:A=H:H) DO is low. Thus QSL NAND gate 501 is capable of detecting the encoded B:A components of quad-state signals input on VI, performing the NAND gate 520 logic operation on the detected B:A components, and outputting the results of the NAND gate 520 logic operation on DO of 501 as indicated in truth table 510.

In FIG. 6, a QSL NAND gate 601 comprises a first path between 3V and 0V consisting of transistor 602 and current source 603, a second path between 3V and 0V consisting of transistor 604 and current source 606, and an OR gate 605. The first input to OR gate 605 is inverted and connected to a node between transistor 602 and current source 603, and the second input to OR gate 605 is connected to a node between transistor 604 and current source 606. The gate inputs of transistors 602 and 604 are connected to a VI input and the output of OR gate 605 is connected to a DO output. When the voltage on VI is less than Vt1 (0.5V), transistor 602 is on and transistor 604 is off. In this condition, both the first and second inputs of OR gate 605 are high, resulting in a high output on DO. When the voltage on VI is greater than Vt1 (0.5V) but less than Vt2 (1.5), both transistor 602 and 604 are on. In this condition, the first input of OR 605 is high and the second input of OR 605 is low, resulting in a low output on DO. When the voltage on VI is greater than Vt2 (1.5V), transistor 602 is off and transistor 604 is on. In this condition, the first input of OR 605 is low and the second input of OR 605 is low, resulting in a high output on DO.

Truth table 610 depicts the logical operation of the QSL NAND gate 601. From truth table 610, it is seen that QSL NAND 601 duplicates the logical operation of conventional TSL NAND 620 in that: (1) when VI is 0V (B:A=L:L) DO is high, (2) when VI is 1V (B:A=L:H) DO is low, (3) when VI is 2V (B:A=H:L) DO is high, and (4) when VI is 3V (B:A=H:H) DO is high. Thus QSL NAND gate 601 is capable of detecting the encoded B:A components of quad-state signals input on VI, performing the NAND gate 620 logic operation on the detected B:A components, and outputting the results of the NAND gate 620 logic operation on DO of 601 as indicated in truth table 610.

In FIG. 7, a QSL NAND gate 701 comprises a first path between 3V and 0V consisting of transistor 702 and current source 703, a second path between 3V and 0V consisting of transistor 704 and current source 706, and an OR gate 705. The first input to OR gate 705 is inverted and connected to a node between transistor 702 and current source 703, and the second input to OR gate 705 is connected to a node between transistor 704 and current source 706. The gate inputs of transistors 702 and 704 are connected to a VI input and the output of OR gate 705 is connected to a DO output. When the voltage on VI is less than Vt2 (1.5V), transistor 702 is on and transistor 704 is off. In this condition, both the first and second inputs of OR gate 705 are high, resulting in a high output on DO. When the voltage on VI is greater than Vt2 (1.5V) but less than Vt3 (2.5), both transistor 702 and 704 are on. In this condition, the first input of OR 705 is high and the second input of OR 705 is low, resulting in a low output on DO. When the voltage on VI is greater than Vt3 (2.5V), transistor 702 is off and transistor 704 is on. In this condition, the first input of OR 705 is low and the second input of OR 705 is low, resulting in a high output on DO.

Truth table 710 depicts the logical operation of the QSL NAND gate 701. From truth table 710, it is seen that QSL NAND 701 duplicates the logical operation of conventional TSL NAND 720 in that: (1) when VI is 0V (B:A=L:L) DO is high, (2) when VI is 1V (B:A=L:H) DO is high, (3) when VI is 2V (B:A=H:L) DO is low, and (4) when VI is 3V (B:A=H:H) DO is high. Thus QSL NAND gate 701 is capable of detecting the encoded B:A components of quad-state signals input on VI, performing the NAND gate 720 logic operation on the detected B:A components, and outputting the results of the NAND gate 720 logic operation on DO of 701 as indicated in truth table 710.

In FIG. 8, a QSL NAND gate 801 comprises transistor 803, current source 802, and inverting output buffer 804. Transistor 803 and current source 802 form a path between the 3V and 0V supplies. The input to buffer 804 is connected to a node in the path between transistor 803 and current source 802. The gate input of transistor 803 is connected to a VI input and the output of buffer 804 is connected to a DO output. When the voltage on VI is less than Vt1 (0.5V), transistor 803 is off and no current flows in the path, creating a voltage at the buffer 804 input that drives a low output on DO. When the voltage on VI is greater than Vt1 (0.5V), transistor 803 is on and current flows in the path, creating a voltage at the buffer 804 input that drives a high output on DO.

Truth table 810 depicts the logical operation of the QSL NAND gate 801. From truth table 810, it is seen that QSL NAND 801 duplicates the logical operation of conventional TSL NAND 820 in that: (1) when VI is 0V (B:A=L:L) DO is low, (2) when VI is 1V (B:A=L:H) DO is high. (3) when VI is 2V (B:A=H:L) DO is high, and (4) when VI is 3V (B:A=H:H) DO is high. Thus QSL NAND gate 801 is capable of detecting the encoded B:A components of quad-state signals input on VI, performing the NAND gate 820 logic operation on the detected B:A components, and outputting the results of the NAND gate 820 logic operation on DO of 801 as indicated in truth table 810.

QSL AND Gates

FIGS. 9 through 12 illustrate QSL AND gates designed to input B:A encoded quad-state signals, perform logical AND operations on the encoded B and A components of the signals, and output two-state logic signals representative of the result of the logical AND operations performed.

In FIG. 9, a QSL AND gate 901 comprises transistor 902, current source 903, and inverting output buffer 904. Transistor 902 and current source 903 form a path between the 3V and 0V supplies. The input to buffer 904 is connected to a node in the path between transistor 902 and current source 903. The gate input of transistor 902 is connected to a VI input and the output of buffer 904 is connected to a DO output. When the voltage on VI is less than Vt3 (2.5V), transistor 902 is on and current flows in the path, creating a voltage at the buffer 904 input that drives a low output on DO. When the voltage on VI is greater than Vt3 (2.5V), transistor 902 is off and no current flows in the path, creating a voltage at the buffer 904 input that drives a high output on DO.

Truth table 910 depicts the logical operation of the QSL AND gate 901. From truth table 910, it is seen that QSL AND 901 duplicates the logical operation of conventional TSL AND 920 in that: (1) when VI is 0V (B:A=L:L) DO is low, (2) when VI is 1V (B:A=L:H) DO is low, (3) when VI is 2V (B:A=H:L) DO is low, and (4) when VI is 3V (B:A=H:H) DO is high. Thus QSL AND gate 901 is capable of detecting the encoded B:A components of quad-state signals input on VI, performing the AND gate 920 logic operation on the detected B:A components, and outputting the results of the AND gate 920 logic operation on DO of 901 as indicated in truth table 910.

In FIG. 10, a QSL AND gate 1001 comprises a first path between 3V and 0V consisting of transistor 1002 and current source 1003, a second path between 3V and 0V consisting of transistor 1004 and current source 1006, and a NOR gate 1005. The first input to NOR gate 1005 is inverted and connected to a node between transistor 1002 and current source 1003, and the second input to NOR gate 1005 is connected to a node between transistor 1004 and current source 1006. The gate inputs of transistors 1002 and 1004 are connected to a VI input and the output of NOR gate 1005 is connected to a DO output When the voltage on VI is less than Vt1 (0.5V), transistor 1002 is on and transistor 1004 is off. In this condition, both the first and second inputs of NOR gate 1005 are high, resulting In a low output on DO. When the voltage on VI is greater than Vt1 (0.5V) but less than Vt2 (1.5), both transistor 1002 and 1004 are on. In this condition, the first input of NOR 1005 is high and the second input of NOR 1005 is low, resulting in a high output on DO. When the voltage on VI is greater than Vt2 (1.5V), transistor 1002 is off and transistor 1004 is on. In this condition, the first input of NOR 1005 is low and the second input of NOR 1005 is low, resulting in a low output on DO.

Truth table 1010 depicts the logical operation of the QSL AND gate 1001. From truth table 1010, it is seen that QSL AND 1001 duplicates the logical operation of conventional TSL AND 1020 in that: (1) when VI is 0V (B:A=L:L) DO is low, (2) when VI is 1V (B:A=L:H) DO is high, (3) when VI is 2V (B:A=H:L) DO is low, and (4) when VI is 3V (B:A=H:H) DO is low. Thus QSL AND gate 1001 is capable of detecting the encoded B:A components of quad-state signals input on VI, performing the AND gate 1020 logic operation on the detected B:A components, and outputting the results of the AND gate 1020 logic operation on DO of 1001 as indicated in truth table 1010.

In FIG. 11, a QSL AND gate 1101 comprises a first path between 3V and 0V consisting of transistor 1102 and current source 1103, a second path between 3V and 0V consisting of transistor 1104 and current source 1106, and a NOR gate 1105. The first input to NOR gate 1105 is inverted and connected to a node between transistor 1102 and current source 1103, and the second input to NOR gate 1105 is connected to a node between transistor 1104 and current source 1106. The gate inputs of transistors 1102 and 1104 are connected to a VI input and the output of NOR gate 1105 is connected to a DO output. When the voltage on VI is less than Vt2 (1.5V), transistor. 1102 is on and transistor 1104 is off. In this condition, both the first and second inputs of NOR gate 1105 are high, resulting in a low output on DO. When the voltage on VI is greater than Vt2 (1.5V) but less than Vt3 (2.5), both transistor 1102 and 1104 are on. In this condition, the first input of NOR 1105 is high and the second input of NOR 1105 is low, resulting in a high output on DO. When the voltage on VI is greater than Vt3 (2.5V), transistor 1102 is off and transistor 1104 is on. In this condition, the first input of NOR 1105 is low and the second input of NOR 1105 is low, resulting in a low output on DO.

Truth table 1101 depicts the logical operation of the QSL AND gate 1101. From truth table 1110, it is seen that QSL AND 1101 duplicates the logical operation of conventional TSL AND 1120 in that: (1) when VI is 0V (B:A=L:L) DO is low, (2) when VI is 1V (B:A=L:H) DO is low, (3) when VI is 2V (B:A=H:L) DO is high, and (4) when VI is 3V (B:A=H:H) DO is low. Thus QSL AND gate 1101 is capable of detecting the encoded B:A components of quad-state signals input on VI, performing the AND gate 1120 logic operation on the detected B:A components, and outputting the results of the AND gate 1120 logic operation on DO of 1101 as indicated in truth table 1110.

In FIG. 12, a QSL AND gate 1201 comprises transistor 1203, current source 1202, and non-inverting output buffer 1204. Transistor 1203 and current source 1202 form a path between the 3V and 0V supplies. The input to buffer 1204 is connected to a node in the path between transistor 1203 and current source 1202. The gate input of transistor 1203 is connected to a VI input and the output of buffer 1204 is connected to a DO output. When the voltage on VI is less than Vt1 (0.5V), transistor 1203 is off and no current flows in the path, creating a voltage at the buffer 1204 input that drives a high output on DO. When the voltage on VI is greater than Vt1 (0.5V), transistor 1203 is on and current flows in the path, creating a voltage at the buffer 1204 input that drives a low output on DO.

Truth table 1210 depicts the logical operation of the QSL AND gate 1201. From truth table 1210, it is seen that QSL AND 1201 duplicates the logical operation of conventional TSL AND 1220 in that: (1) when VI is 0V (B:A=L:L) DO is high, (2) when VI is 1V (B:A=L:H) DO is low, (3) when VI is 2V (B:A=H:L) DO is low, and (4) when VI is 3V (B:A=H:H) DO is low. Thus QSL AND gate 1201 is capable of detecting the encoded B:A components of quad-state signals input on VI, performing the AND gate 1220 logic operation on the detected B:A components, and outputting the results of the AND gate 1220 logic operation on DO of 1201 as indicated in truth table 1210.

QSL NOR Gates

FIGS. 13 through 16 illustrate QSL NOR gates designed to input B:A encoded quad-state signals, perform logical NOR operations on the encoded B and A components of the signals, and output two-state logic signals representative of the result of the logical NOR operations performed.

In FIG. 13, a QSL NOR gate 1301 comprises transistor 1303, current source 1302, and non-inverting output buffer 1304. Transistor 1303 and current source 1302 form a path between the 3V and 0V supplies. The input to buffer 1304 is connected to a node in the path between transistor 1303 and current source 1302. The gate input of transistor 1303 is connected to a VI input and the output of buffer 1304 is connected to a DO output. When the voltage on VI is less than Vt1 (0.5V), transistor 1303 is off and no current flows in the path, creating a voltage at the buffer 1304 input that drives a high output on DO. When the voltage on VI is greater than Vt1 (0.5V), transistor 1303 is on and current flows in the path, creating a voltage at the buffer 1304 input that drives a low output on DO.

Truth table 1310 depicts the logical operation of the QSL NOR gate 1301. From truth table 1310, it is seen that QSL NOR 1301 duplicates the logical operation of conventional TSL NOR 1320 in that: (1) when VI is 0V (B:A=L:L) DO is high, (2) when VI is 1V (B:A=L:H) DO is low, (3) when VI is 2V (B:A=H:L) DO is low, and (4) when VI is 3V (B:A=H:H) DO is low. Thus QSL NOR gate 1301 is capable of detecting the encoded B:A components of quad-state signals input on VI, performing the NOR gate 1320 logic operation on the detected B:A components, and outputting the results of the NOR gate 1320 logic operation on DO of 1301 as indicated in truth table 1310.

In FIG. 14, a QSL NOR gate 1401 comprises a first path between 3V and 0V consisting of transistor 1402 and current source 1403, a second path between 3V and 0V consisting of transistor 1404 and current source 1406, and a NOR gate 1405. The first input to NOR gate 1405 is inverted and connected to a node between transistor 1402 and current source 1403, and the second input to NOR gate 1405 is connected to a node between transistor 1404 and current source 1406. The gate inputs of transistors 1402 and 1404 are connected to a VI input and the output of NOR gate 1405 is connected to a DO output. When the voltage on VI is less than Vt2 (1.5V), transistor 1402 is on and transistor 1404 is off. In this condition, both the first and second inputs of NOR gate 1405 are high, resulting in a low output on DO. When the voltage on VI is greater than Vt2 (1.5V) but less than Vt3 (2.5), both transistor 1402 and 1404 are on. In this condition, the first input of NOR 1405 is high and the second input of NOR 1405 is low, resulting in a high output on DO. When the voltage on VI is greater than Vt3 (2.5V), transistor 1402 is off and transistor 1404 is on. In this condition, the first input of NOR 1405 is low and the second input of NOR 1405 is low, resulting in a low output on DO.

Truth table 1410 depicts the logical operation of the QSL NOR gate 1401. From truth table 1410, it is seen that QSL NOR 1401 duplicates the logical operation of conventional TSL NOR 1420 in that: (1) when VI is 0V (B:A=L:H) DO is low, (2) when VI is 1V (B:A=L:H) DO is low, (3) when VI is 2V (B:A=H:L) DO is high, and (4) when VI is 3V (B:A=H:H) DO is low. Thus QSL NOR gate 1401 is capable of detecting the encoded B:A components of quad-state signals input on VI, performing the NOR gate 1420 logic operation on the detected B:A components, and outputting the results of the NOR gate 1420 logic operation on DO of 1401 as indicated in truth table 1410.

In FIG. 15, a QSL NOR gate 1501 comprises a first path between 3V and 0V consisting of transistor 1502 and current source 1503, a second path between 3V and 0V consisting of transistor 1504 and current source 1506, and a NOR gate 1505. The first input to NOR gate 1505 is inverted and connected to a node between transistor 1502 and current source 1503, and the second input to NOR gate 1505 is connected to a node between transistor 1504 and current source 1506. The gate inputs of transistors 1502 and 1504 are connected to a VI input and the output of NOR gate 1505 is connected to a DO output. When the voltage on VI is less than Vt1 (0.5V), transistor 1502 is on and transistor 1504 is off. In this condition, both the first and second inputs of NOR gate 1505 are high, resulting in a low output on DO. When the voltage on VI is greater than Vt1 (0.5V) but less than Vt2 (1.5), both transistor 1502 and 1504 are on. In this condition, the first input of NOR 1505 is high and the second input of NOR 1505 is low, resulting in a high output on DO. When the voltage on VI is greater than Vt2 (1.5V), transistor 1502 is off and transistor 1504 is on. In this condition, the first input of NOR 1505 is low and the second input of NOR 1505 is low, resulting in a low output on DO.

Truth table 1510 depicts the logical operation of the QSL NOR gate 1501. From truth table 1510, it is seen that QSL NOR 1501 duplicates the logical operation of conventional TSL NOR 1520 in that: (1) when VI is 0V (B:A=L:H) DO is low, (2) when VI is 1V (B:A=L:H) DO is high, (3) when VI is 2V (B:A=H:L) DO is low, and (4) when VI is 3V (B:A=H:H) DO is low. Thus QSL NOR gate 1501 is capable of detecting the encoded B:A components of quad-state signals input on VI, performing the NOR gate 1520 logic operation on the detected B:A components, and outputting-the results of the NOR gate 1520 logic operation on DO of 1501 as indicated in truth table 1510.

In FIG. 16, a QSL NOR gate 1601 comprises transistor 1602, current source 1603, and inverting output buffer 1604. Transistor 1602 and current source 1603 form a path between the 3V and 0V supplies. The input to buffer 1604 is connected to a node in the path between transistor 1602 and current source 1603. The gate input of transistor 1602 is connected to a VI input and the output of buffer 1604 is connected to a DO output. When the voltage on VI is less than Vt3 (2.5V), transistor 1602 is on and current flows in the path, creating a voltage at the buffer 1604 input that drives a low output on DO. When the voltage on VI is greater than Vt3 (2.5V), transistor 1602 is off and no current flows in the path, creating a voltage at the buffer 1604 input that drives a high output on DO.

Truth table 1610 depicts the logical operation of the QSL NOR gate 1601. From truth table 1610, it is seen that. QSL NOR 1601 duplicates the logical operation of conventional TSL NOR 1620 in that: (1) when VI is 0V (B:A=L:H) DO is low, (2) when VI is 1V (B:A-L:H) DO is low, when VI is 2V (B:A=H:L) DO is low, and (4) when VI is 3V (B:A=H:H) DO is high. Thus QSL NOR gate 1601 is capable of detecting the encoded B:A components of quad-state signals input on VI, performing the NOR gate 1620 logic operation on the detected B:A components, and outputting the results of the NOR gate 1620 logic operation on DO of 1601 as indicated in truth table 1610.

QSL OR Gates

FIGS. 17 through 20 illustrate QSL OR gates designed to input B:A encoded quad-state signals, perform logical OR operations on the encoded B and A components of the signals, and output two-state logic signals representative of the result of the logical OR operations performed.

In FIG. 17, a QSL OR gate 1701 comprises transistor 1703, current source 1702, and inverting output buffer 1704. Transistor 1703 and current source 1702 form a path between the 3V and 0V supplies. The input to buffer 1764 is connected to a node in the path between transistor 1703 and current source 1702. The gate input of transistor 1703 is connected to a VI input and the output of buffer 1704 is connected to a DO output. When the voltage on VI is less than Vt1 (0.5V), transistor 1703 is off and no current flows in the path, creating a voltage at the buffer 1704 input that drives a low output on DO. When the voltage on VI is greater than Vt1 (0.5V), transistor 1703 is on and current flows in the path, creating a voltage at the buffer 1704 input that drives a high output on DO.

Truth table 1710 depicts the logical operation of the QSL OR gate 1701. From truth table 1710, it is seen that QSL OR 1701 duplicates the logical operation of conventional TSL OR 1720 in that: (1) when VI is 0V (B:A=L:L) DO is low, (2) when VI is 1V (B:A=L:H) DO is high, (3) when VI is 2V (B:A=H:L) DO is high, and (4) when VI is 3V (B:A=H:H) DO is high. Thus QSL OR gate 1701 is capable of detecting the encoded B:A components of quad-state signals input on VI, performing the OR gate 1720 logic operation on the detected B:A components, and outputting the results of the OR gate 1720 logic operation on DO of 1701 as indicated in truth table 1710.

In FIG. 18, a QSL OR gate 1801 comprises a first path between 3V and 0V consisting of transistor 1802 and current source 1803, a second path between 3V and 0V consisting of transistor 1804 and current source 1806, and a OR gate 1805. The first input to OR gate 1805 is inverted and connected to a node between transistor 1802 and current source 1803, and the second input to OR gate 1805 is connected to a node between transistor 1804 and current source 1806. The gate inputs of transistors 1802 and 1804 are connected to a VI input and the output of OR gate 1805 is connected to a DO output. When the voltage on VI is less than Vt2 (1.5V), transistor 1802 is on and transistor 1804 is off. In this condition, both the first and second inputs of OR gate 1805 are high, resulting in a high output on DO. When the voltage on VI is greater than Vt2 (1.5V) but less than Vt3 (2.5), both transistor 1802 and 1804 are on. In this condition, the first input of OR 1805 is high and the second input of OR 1805 is low, resulting in a low output on DO. When the voltage on VI is greater than Vt3 (2.5V), transistor 1802 is off and transistor 1804 is on. In this condition, the first input of OR 1805 is low and the second input of OR 1805 is low, resulting in a high output on DO.

Truth table 1810 depicts the logical operation of the QSL OR gate 1801. From truth table 1810, it is seen that QSL OR 1801 duplicates the logical operation of conventional TSL OR 1820 in that: (1) when VI is 0V (B.A=L:L) DO is high, (2) when VI is 1V (B:A=L:H) DO is high, (3) when VI is 2V (B:A=H:L) DO is low, and (4) when VI is 3V (B:A=H:H) DO is high. Thus QSL OR gate 1801 is capable of detecting the encoded B:A components of quad-state signals input on VI, performing the OR gate 1820 logic operation on the detected B:A components, and outputting the results of the OR gate 1820 logic operation on DO 1801 as indicated in truth table 1810.

In FIG. 19, a QSL OR gate 1901 comprises a first path between 3V and 0V consisting of transistor 1902 and current source 1903, a second path between 3V and 0V consisting of transistor 1904 and current source 1906, and a OR gate 1905. The first input to OR gate 1905 is inverted and connected to a node between transistor 1902 and current source 1903, and the second input to OR gate 1905 is connected to a node between transistor 1904 and current source 1906. The gate inputs of transistors 1902 and 1904 are connected to a VI input and the output of OR gate 1905 is connected to a DO output. When the voltage on VI is less than Vt1 (0.5V), transistor 1902 is on and transistor 1904 is off. In this condition, both the first and second inputs of OR gate 1905 are high, resulting in a high output on DO. When the voltage on VI is greater than Vt1 (0.5V) but less than Vt2 (1.5), both transistor 1902 and 1904 are on. In this condition, the first input of OR 1905 is high and the second input of OR 1905 is low, resulting in a low output on DO. When the voltage on VI is greater than Vt2 (1.5V), transistor 1902 is off and transistor 1904 is on. In this condition, the first input of OR 1905 is low and the second input of OR 1905 is low, resulting in a high output on DO.

Truth table 1910 depicts the logical operation of the QSL OR gate 1901. From truth table 1910, it is seen that QSL OR 1901 duplicates the logical operation of conventional TSL OR 1920 in that: (1) when VI is 0V (B:A=L:L) DO is high, (2) when VI is 1V (B:A=L:H) DO is low, (3) when VI is 2V (B:A=H:L) DO is high, and (4) when VI is 3V (B:A=H:H) DO is high. Thus QSL OR gate 1901 is capable of detecting the encoded B:A components of quad-state signals input on VI, performing the OR gate 1920 logic operation on the detected B:A components, and outputting the results of the OR gate 1920 logic operation on DO of 1901 as indicated in truth table 1910.

In FIG. 20, a QSL OR gate 2001 comprises transistor 2002, current source 2003, and non-inverting output buffer 2004. Transistor 2002 and current source 2003 form a path between the 3V and 0V supplies. The input to buffer 2004 is connected to a node in the path between transistor 2002 and current source 2003. The gate input of transistor 2002 is connected to a VI input and the output of buffer 2004 is connected to a DO output. When the voltage on VI is less than Vt3 (2.5V), transistor 2002 is on and current flows in the path, creating a voltage at the buffer 2004 input that drives a high output on DO. When the voltage on VI is greater than Vt–3 (2.5V), transistor 2002 is off and no current flows in the path, creating a voltage at the buffer 2004 input that drives a low output on DO.

Truth table 2010 depicts the logical operation of the QSL OR gate 2001. From truth table 2010, it is seen that QSL-OR 2001 duplicates the logical operation of conventional TSL OR 2020 in that: (1) when VI is 0V (B:A=L:L) DO is high, (2) when VI is 1V (B:A=L:H) DO is high, (3) when VI is 2V (B:A=H:L) DO is high, and (4) when VI is 3V (B:A=H:H) DO is low. Thus QSL OR gate 2001 is capable of detecting the encoded B:A components of quad-state signals input on VI, performing the OR gate 2020 logic operation on the detected B:A components, and outputting the results of the OR gate 2020 logic operation on DO of 2001 as indicated in truth table 2010.

QSL XOR Gates

FIGS. 21 and 22 illustrate QSL XOR gates designed to input B:A encoded quad-state signals, perform logical XOR operations on the encoded B and A components of the signals, and output two-state logic signals representative of the result of the logical XOR operations performed.

In FIG. 21, a QSL XOR gate 2101 comprises a first path between 3V and 0V consisting of transistor 2102 and current source 2103, a second path between 3V and 0V consisting of transistor 2104 and current source 2106, and a NOR gate 2105. The first input to NOR gate 2105 is inverted and connected to a node between transistor 2102 and current source 2103, and the second input to NOR gate 2105 is connected to a node between transistor 2104 and current source 2106. The gate inputs of transistors 2102 and 2104 are connected to a VI input and the output of NOR gate 2105 is connected to a DO output. When the voltage on VI is less than Vt1 (0.5V), transistor 2102 is on and transistor 2104 is off. In this condition, both the first and second inputs of NOR gate 2105 are high, resulting in a low output on DO. When the voltage on VI is greater than Vt1 (0.5V) but less than Vt3 (2.5), both transistor 2102 and 2104 are on. In this condition, the first input of NOR 2105 is high and the second input of NOR 2105 is low, resulting in a high output on DO. When the voltage on VI is greater than Vt3 (2.5V), transistor 2102 is off and transistor 2104 is on. In this condition, the first input of NOR 2105 is low and the second input of NOR 2105 is low, resulting in a low output on DO.

Truth table 2110 depicts the logical operation of the QSL XOR gate 2101. From truth table 2110, it is seen that QSL XOR 2101 duplicates the logical operation of either of the conventional TSL XOR gates 2121 and 2122 of 2120 in that: (1) when VI is 0V (B:A=L:L) DO is low, (2) when VI is 1V (B:A=L:H) DO is high, (3) when VI is 2V (B:A=H:L) DO is high, and (4) when VI is 3V (B:A=H:H) DO is low. Thus QSL XOR gate 2101 is capable of detecting the encoded B:A components of quad-state signals input on VI, performing the XOR gate 2121 or 2122 logic operation on the detected B:A components, and outputting the results of the XOR gate 2121 or 2122 logic operation on DO of 2101 as indicated in truth table 2110.

In FIG. 22, a QSL XOR gate 2201 is shown being identical to QSL XOR 2101 of FIG. 21 with the exception that the NOR gate 2105 of XOR 2101 has been changed to an OR gate 2205 in XOR 2201. Truth table 2210 depicts the logical operation of the QSL XOR gate 2201. From truth table 2210, it is seen that QSL XOR 2201 duplicates the logical operation of either of the conventional TSL XOR gates 2221 and 2222 of 2120 in that: (1) when VI is 0V (B:A=L:L) DO is high, (2) when VI is 1V (B:A=L:H) DO is low, (3) when VI is 2V (B:A=H:L) DO is low, and (4) when VI is 3V (B:A=H:H) DO is high. Thus QSL XOR gate 2201 is capable of detecting the encoded B:A components of quad-state signals input on VI, performing the XOR gate 2221 or 2222 logic operation on the detected B:A components, and outputting the results of the XOR gate 2221 or 2222 logic operation on DO of 2201 as indicated in truth table 2210.

Two-State and Quad-State Gate Comparison

Figure 23:
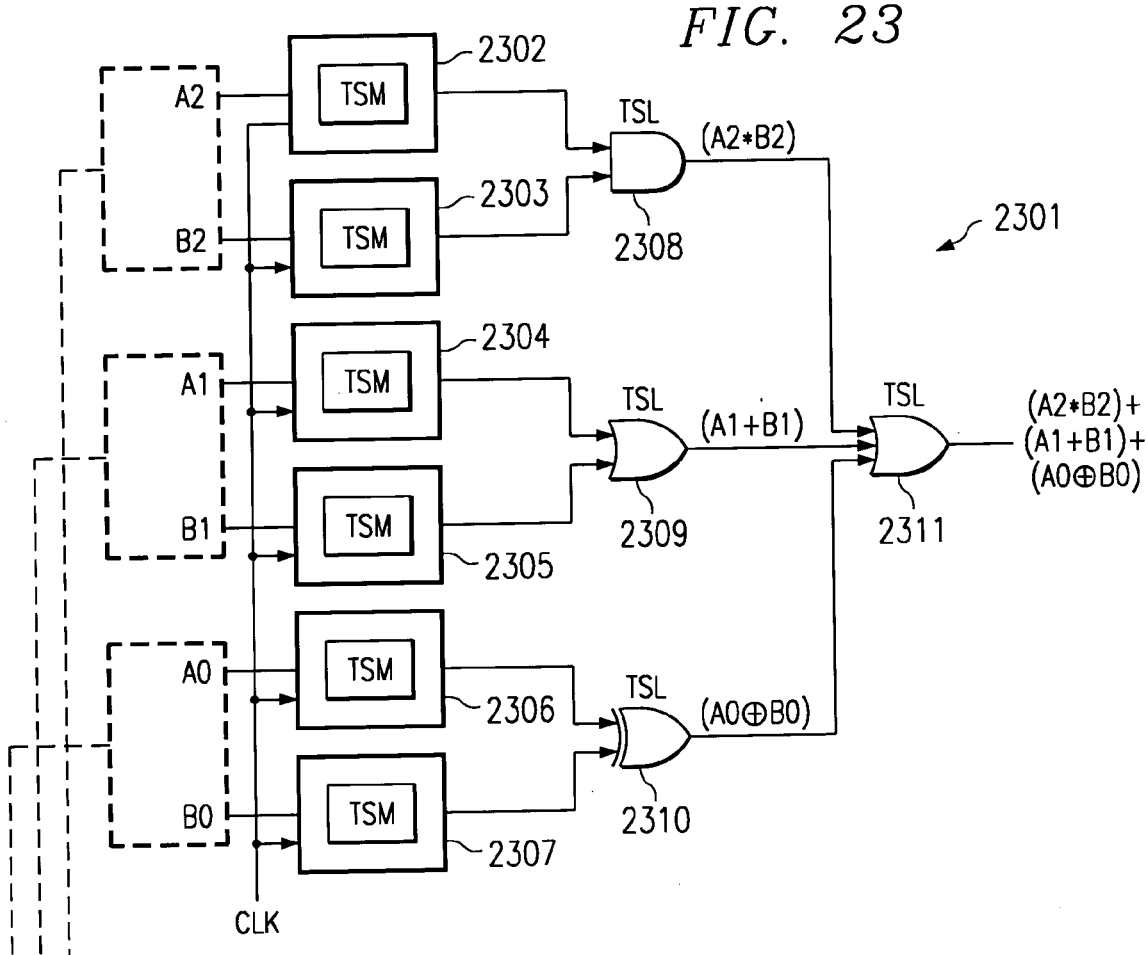
FIG. 23 illustrates a conventional two-state logic circuit.

In FIG. 23, a conventional two-state logic circuit example 2301 is illustrated. Circuit 2301 could be a small portion of a much larger circuit within an integrated circuit. Circuit 2301 comprises conventional two-state memories (TSM) 2302–2307, TSL AND gate 2308, TSL OR gate 2309, TLS XOR gate 2310, and TSL OR gate 2311. When clocked, TSM 2307 stores B0 data, TSM 2306 stores A0 data, TSM 2305 stores B1 data, TSM 2304 stores A1 data, TSM 2303 stores B2 data, and TSM 2302 stores A2 data. The A0–A2 and B0–B2 inputs are assumed to come from a two-state signal source coupled to circuit 2301. If the two-state signal source is external of the integrated circuit, the A0–A2 and B0–B2 inputs come from pads. If the two-state signal source is internal to the integrated circuit, the A0–A2 and B0–B2 inputs come from a circuit within the integrated circuit. The A2 data stored in TSM 2302 and B2 data stored in TSM 2303 are input to AND gate 2308, the A1 data stored in TSM 2304 and B1 data stored in TSM 2305 are input to OR gate 2309, and the A0 data stored in TSM 2306 and B0 data stored in TSM2307 are input to XOR gate 2310. The outputs from gates 2308–2310 are input to OR gate 2311. The Boolean logic operations performed by each of the gates in 2301 are indicated at the gate outputs.

Figure 24:
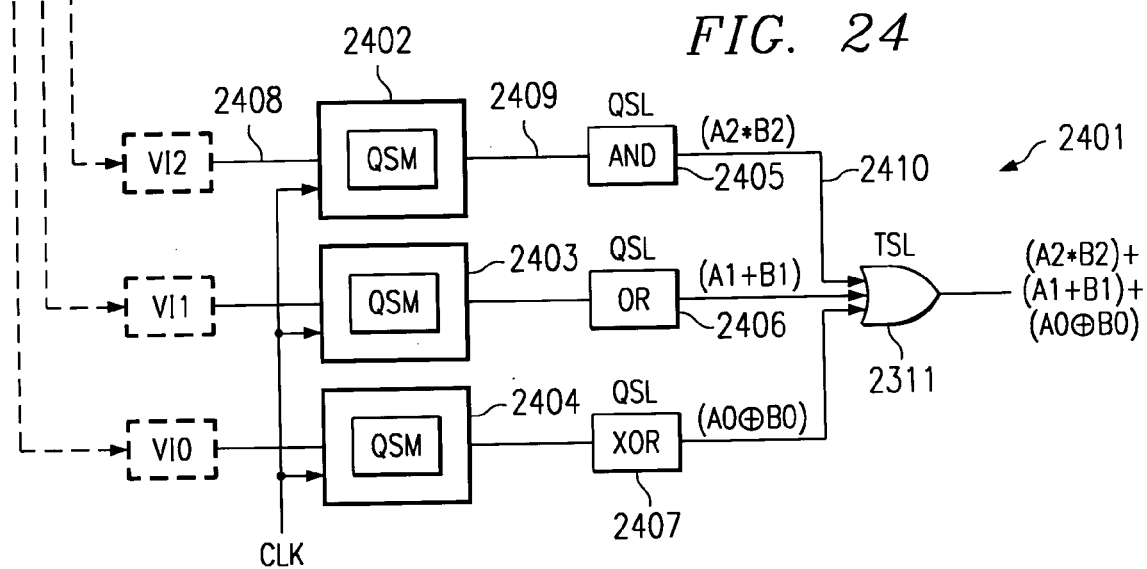
FIG. 24 illustrates a quad-state logic circuit according to the present invention.

In FIG. 24, a quad-state logic circuit example 2401 is illustrated. Circuit 2401 could also be a small portion of a much larger circuit within an integrated circuit. Circuit 2401 comprises quad-state memories (QSMs 100 of FIG. 1) 2402–2404, QSL AND gate 2405 (QSL AND gate 901 of FIG. 9), QSL OR gate 2406 (QSL OR gate 1701 of FIG. 17), QSL XOR gate 2407 (QSL XOR gate 2101 of FIG. 21), and TSL OR gate 2311. When clocked, QSM 2404 stores quad-state signal VI0, QSM 2403 stores quad-state signal VI1, and QSM 2402 stores quad-state signal VI2. The VI0–VI2 signal inputs are assumed to come from a quad-state signal source coupled to circuit 2401. If the quad-state signal source is external of the integrated circuit, the VI0–VI2 inputs come from pads. If the quad-state signal source is internal to the integrated circuit, the VI0–VI2 inputs come from a quad-state circuit within the integrated circuit. In this example, it is assumed that quad-state signal input VI0 encodes the B0 and A0 data inputs to circuit 2301, input VI1 encodes the B1 and A1 data inputs to circuit 2301, and input VI2 encodes the B2 and A2 data inputs to circuit 2301. This is indicated by the dotted lines between circuit 2301 and 2401. This encoding could be achieved, for example, by using three C-gates 400 of FIG. 4 to compress B0:A0 into VI0, B1:A1 into VI1, and B2:A2 into VI2. The quad-state signal VI2 stored in QSM 2402 is input to QSL AND gate 2405, the quad-state signal VI1 stored in QSM 2403 is input to QSL OR gate 2406, and the quad-state signal VI0 stored in QSM 2404 is input to QSL XOR gate 2407. The signals output from QSL gates 2405–2407 are input to OR gate 2311. The Boolean logic operations performed by each of the gates in 2401 are indicated at the gate outputs.

In comparing circuit 2301 and 2401 the following conclusions can be reached. It is again mentioned that circuits 2301 and 2401 are intentionally simplified and reduced in size and complexity for the sake of simplifying the description. However, to better appreciate the significance of the following conclusions, it should be understood that any number of memories and logic elements may be used in circuits 2301 and 2401, and in various connection arrangements. For example, the circuits 2301 and 2401 may each represent a significant circuit architecture, such as a digital signal processor (DSP). Circuit 2301 would represent the DSP architecture using a conventional two-state memory and logic design methodology, whereas circuit 2401 would represent the DSP architecture using the quad-state memory and logic design methodology of the present invention.

QSM 2402 and QSL 2405 duplicates the storage and logic operation of TSM 2302, TSM 2303, and TSL 2308. QSM 2403 and QSL 2406 duplicates the storage and logic operation of TSM 2304, TSM 2305, and TSL 2309. QSM 2404 and QSL 2407 duplicates the storage and logic operation of TSM 2306, TSM 2307, and TSL 2310. Thus circuit area overhead is reduced by the present invention.

If the inputs to QSMs 2402–2404 comes from integrated circuit pads, the number of pads required for circuit 2401 is one half the number of pads required for circuit 2301. Thus integrated circuit pad count is reduce by the present invention, enabling the assembly of integrated circuits into smaller pin count packages.

In circuit 2301, the clock drives the clock inputs of TSMs 2302–2307. In circuit 2401, the clock drives the clock inputs of QSMs 2402–2404. Thus the clock driver in circuit 2401 needs to drive only one half the clock input load of circuit 2301. Also the clock interconnect routing in circuit 2401 can be better optimized since fewer clock input connections are required.

The interconnect wiring required between QSMs 2402–2404 and QSLs 2405–2407 is one half the interconnect wiring required between TSMs 2302–2307 and TSLs 2308–2310. Thus wiring area overhead is reduced by the present invention.

Since the interconnect wiring is reduced by one half, as mentioned in (2), the power (P=CV.sup.2F) consumed by the charging and discharging of the capacitance (C) of the interconnect during circuit operation is also reduced by one half. Thus power consumed by the charging and discharging of the capacitive interconnections between circuit elements is reduced by the present invention.

Further power (P=CV.sup.2F reduction can be seen in that the quad-state signal voltage (V.sup.2) transitions between QSMs 2402–2404 and QSLs 2405–2407 are, for some B:A encoded signal transfers, reduced to transitioning between 0V & 1V (B:A=L:L & B:A=L:H encoded transitions), 1V & 2V (B:A=L:H & B:A=H:L encoded transitions), 2V & 3V (B:A=H:L & B:A=H:H encoded transitions), 0V & 2V (B:A=L:L & B:A=H:L encoded transitions), and 1V & 3V (B:A=L:H & B:A=H:H encoded transitions). In contrast, all data signals transferred between TSMs 2302–2307 and TSLs 2308–2310 swing between traditional two-state voltage levels, for example 0V (low) and 3V (high).

QSL Macro Gates

QSL gates of FIGS. 5–22 illustrate fundamental Boolean gating circuits. The following describes how these fundamental QSL gating circuits can be used to design more complex QSL macro gate circuits for use within integrated circuits. While only two examples of QSL macro gates will be shown and described, it should be understood that any number and variety of QSL macro gates could be designed from the teachings described below.

QSL "AND-OR-INVERT" Gate

Figures 25A, 25B, 25C, 25D:
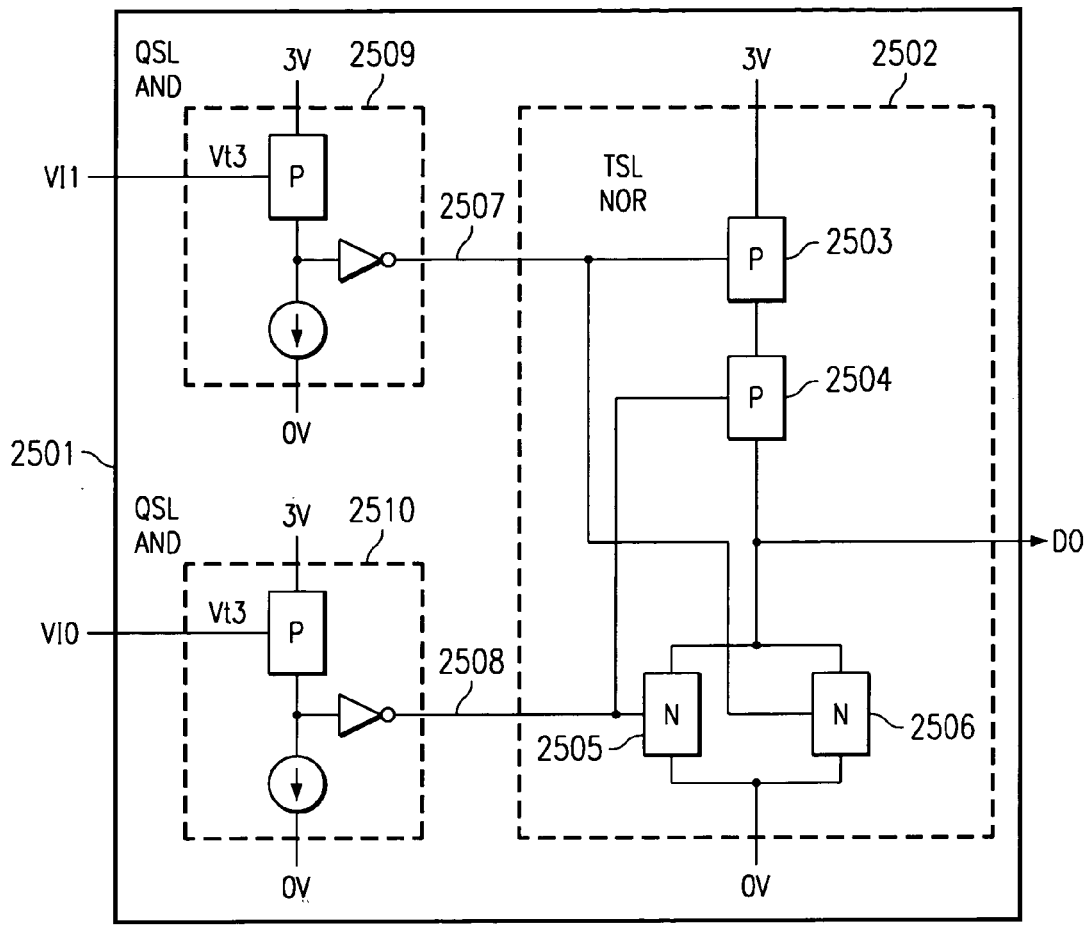

FIG. 25 illustrates a QSL circuit 2501 that realizes the AND-OR-INVERT (AOI) logic function. AOI circuit 2501 consists of a QSL AND gate 901 2509, a QSL AND gate 901 2510, and a TSL NOR gate 2502. NOR gate 2502 comprises transistors 2503–2506 connected as shown to realize the NOR logic function AND gate 2509 inputs a quad-state signal via VI1 and outputs the AND of the signal to a first input 2507 of NOR gate 2502. AND gate 2510 inputs a quad-state signal via VI0 and outputs the AND of the signal to a second input 2508 of NOR gate 2502. NOR gate 2502 outputs the NOR of the fmt and second inputs to a DO output. Truth tables 2530 and 2531 indicate the quad-state signal BI:AL and B0:A0 encodings for VI1 and VI0 respectively. Truth table 910 indicates the quad-state AND operations performed by AND gates 2509 and 2510. QSL AOI 2501 duplicates the logical operation of conventional TSL AOI circuit 2520 which comprises TSL AND gates 2521 and 2522 and TSL NOR gate 2523.

Truth table 2540 depicts the logical operation of the QSL AOI gate 2501. To simplify the understanding of truth table 2540, the BI:AL encoding from truth table 2530 is indicated in parenthesis for each VI1 signal. Likewise, the B0:A0 encoding from truth table 2531 is indicated in parenthesis for each VI0 signal. The encoded BI:AI and B0:A0 indications in truth table 2540 also relate to the B1 and A1 inputs to AND gate 2521 and the B0 and A0 inputs to AND gate 2522, respectively. From truth table 2540 it is seen that DO of 2501 is low only if: (1) VI1 is 3V (BI:AI=H:H), (2) VI0 is 3V (B0:A0=H:H), or (3) VI1 and VI0 are both 3V. For all other VI1 and VI0 inputs, DO is high. This relates to the logical operation of AOI 2520 wherein DO of AOI 2520 is low only if. (1) B1:A1=H:H, (2) B0:A0=H:H, or (3) both B1:A1=H:H and B0:A0=H:H. Thus QSL AOI gate 2501 is capable of detecting the encoded BI:AL and B0:A0 components of quad-state signals input on VI1 and VI0, performing the AOI gate 2520 logic operation on the detected BI:AL and B0:A0 components, and outputting the results of the AOI gate 2520 logic operation on DO of 2501 as indicated in truth table 2540.

OSL "OR-AND-INVERT" Gate

FIG. 26 illustrates a QSL circuit 2601 that realizes the OR-AND-INVERT (OAI) logic function. OAI circuit 2601 consists of a QSL OR gate 1701 2609, a QSL OR gate 1701 2610, and a TSL NAND gate 2602. NAND gate 2602 comprises transistors 2603–2606 connected as shown to realize the NAND logic function. OR gate 2609 inputs a quad-state signal via VI1 and outputs the OR of the signal to a first input 2607 of NAND gate 2602. OR gate 2610 inputs a quad-states signed via VI0 and outputs the OR of the signal to a second input 2608 of NAND gate 2602. NAND gate 2602 outputs the NAND of the first and second inputs to a DO output. Truth tables 2630 and 2631 indicate the quad-state signal B1:A1 and B0:A0 encodings for VI1 and VI0 respectively.

Truth table 1710 indicates the quad-state OR operations performed by OR gates 2609 and 2610. QSL OAI 2601 duplicates the logical operation of conventional TSL OAI circuit 2620 which comprises TSL OR gates 2621 and 2622 and TSL NAND gate 2623.

Truth table 2640 depicts the logical operation of the QSL OAI gate 2601. Again, to simplify the understanding of truth table 2640, the BI:AL encoding from truth table 2630 is indicated in parenthesis for each VI1 signal and the B0:A0 encoding from truth table 2631 is indicated in parenthesis for each VI0 signal. The encoded B1:A1 and B0:A0 indications in truth table 2640 also relate to the B1 and A1 inputs to OR gate 2621 and the B0 and A0 inputs to OR gate 2622, respectively. From truth table 2640 it is seen that DO of 2601 is low only if (VI1 inputs a signal that encodes B1:A1=L:H, H:L, or H:H) and (VI0 inputs a signal that encodes B0:A0=L:H, H:L, or H:H). If VI1 inputs a signal that encodes B1:A1=L:L or if VI0 inputs a signal that encodes to B0:A0—L:L, the DO output of 2601 will be high. This relates to the logical operation of OAI 2620 wherein DO of OAI 2620 is low only if (B1:A1=L:H, H:L, or H:H) and (B0:A0=L:H, H:L, or H:H). Thus QSL OAI gate 2601 is capable of detecting the encoded BI:AL and B0:A0 components of quad-state signals input on VI1 and VI0, performing the OAI gate 2620 boric operation on the detected BI:AL and B0:A0 components, and outputting the results of the OAI-crate 2620 logic operation on DO of 2601 as indicated in truth table 2640.

While QSL AND 501 and OR 1701 gates were used in FIGS. 25 and 26 in the desicn examples of QSL macro gates 2501 and 2601, respectively, any of the previously described QSL gates of FIGS. 5–22 could have been used as well. Also while TSL NOR 2502 and NAND 2602 were used in FIGS. 25 and 26, any type of TSL gate could be used as well. Further, while only two QSL gates were described providing input to a two input TSL gate, any number of QSL gates may be used to provide input to a TSL gate or a group of TSL gates having a number of inputs capable of receiving the outputs from QSL gates. Thus any desired logical operation may be realized by using any particular number and type of QSL gating in combination with any particular number and type of TSL gating.

Two-State and Quad-State Macro Gate Comparison

Figure 27:
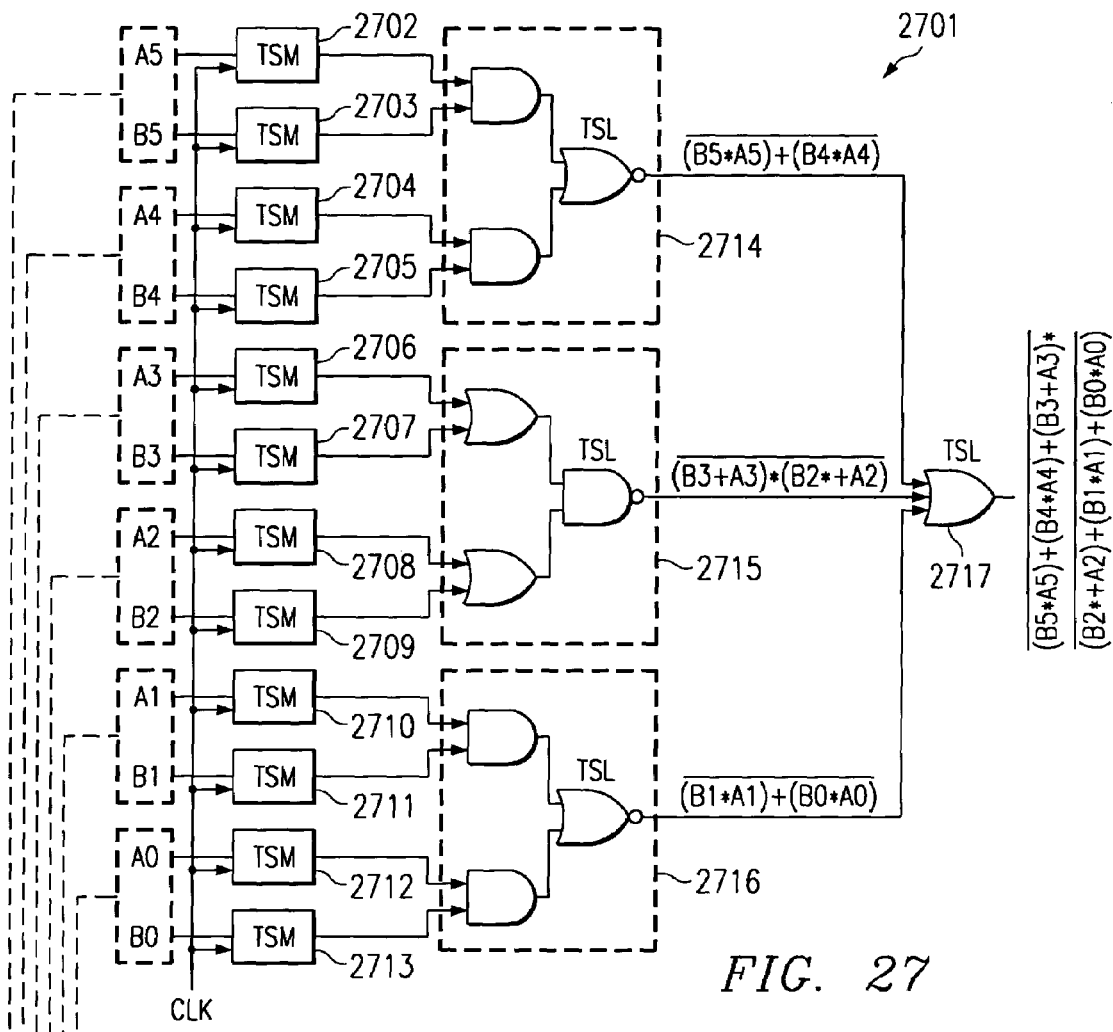
FIG. 27 illustrates a conventional two-state logic circuit.

In FIG. 27, a conventional two-state logic circuit example 2701 is illustrated. Circuit 2701 could be a small portion of a much larger circuit within an integrated circuit. Circuit 2701 comprises conventional two-state memories (TSM) 2702–2313, TSL AOI gate 2714, TSL OAI gate 2715, TLS AOI gate 2716, and TSL OR gate 2117. When clocked, TSM 2713 stores B0 data, TSM 2712 stores A0 data, TSM 2711 stores B1 data, TSM 2710 stores A1 data, TSM 2709 stores B2 data, TSM 2708 stores A2 data, TSM 2707 stores B3 data. TSM 2706 stores A3 data, TSM 2705 stores B4 data, TSM 2704 stores A4 data. TSM 2703 stores B5 data, and TSM 2702 stores A5 data. The A0–A5 and B0–B5 inputs come from a two-state signal source coupled-to circuit 2701. The two-state signal source could be either external of the integrated circuit or internal to the integrated circuit. The A5 data stored in TSM 2702, B5 data stored in TSM 2703, A4 data stored in TSM 2704, and B4 data stored in TSM 2705 are input to AOI gate 2714. The A3 data stored in TSM 2706, B3 data stored in TSM 2707, A2 data stored in TSM 2708, and B2 data stored in TSM 2709 are input to OAI gate 2715. The A1 data stored in TSM 2710, B1 data stored in TSM 2711, A0 data stored in TSM 2712, and B0 data stored in TSM 2713 are input to AOI gate 2716. The outputs from gates 2714–2716 are input to OR gate 2717. The Boolean logic operations performed by each of the gates in 2701 are indicated at the gate outputs.

Figure 28:
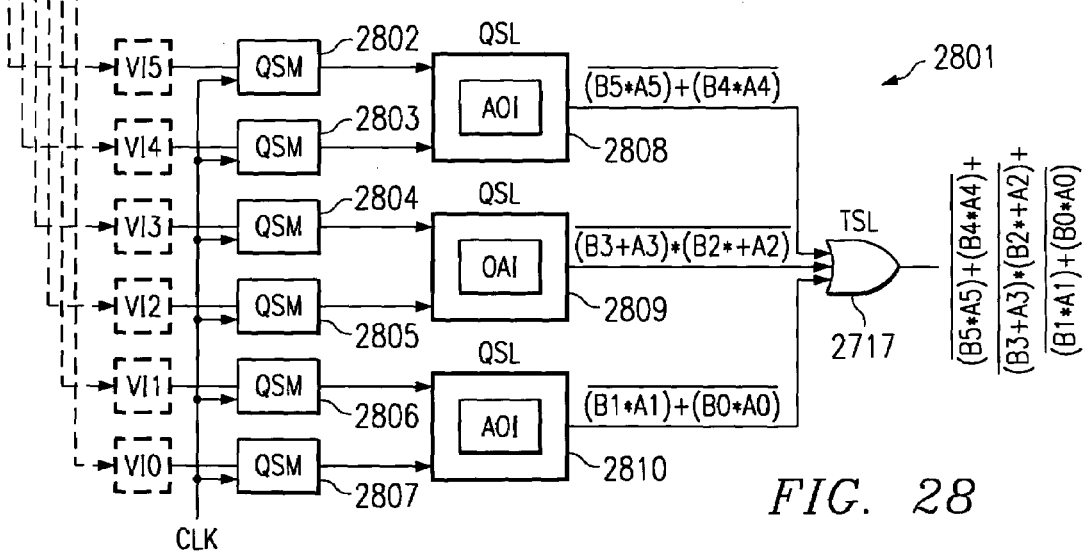
FIG. 28 illustrates a quad-state logic circuit according to the present invention.

In FIG. 28, a quad-state logic circuit example 2801 is illustrated. Circuit 2801 could also be a small portion of a much larger circuit within an integrated circuit. Circuit 2801 comprises QSMs 100 2802–2807, QSL AOI gate 2501 2808, QSL OAI gate 2601 2809, QSL A0 gate 2501 2810, and TSL OR gate 2717. When clocked, QSM 2807 stores quad-state signal VI0, QSM 2806 stores quad-state signal VI1, QSM 2805 stores quad-state signal VI2, QSM 2804 stores quad-state signal VI3, QSM 2803 stores quad-state signal VI4, and QSM 2802 stores quad-state signal VI5. The VI0–VI5 signal inputs come from a quad-state signal source coupled to circuit 2801. The quad-state signal source can be either external of the integrated circuit or internal to the integrated circuit. In this example, it is assumed that quad-state signal input VI0 encodes the B0 and A0 data inputs to circuit 2701, input VI1 encodes the B1 and A1 data inputs to circuit 2701, input VI2 encodes the B2 and A2 data inputs to circuit 2701, input VI3 encodes the B3 and A3 data inputs to circuit 2701, input VI4 encodes the B4 and A4 data inputs to circuit 2701, and input VI5 encodes the B5 and A5 data inputs to circuit 2701. This is indicated by the dotted lines between circuit 2701 and 2801. This encoding could be achieved, for example, by using six C-gates 400 of FIG. 4 to compress B0:A0 into VI0, B1:A1 into VI1, B2, A2 into VI2, B3:A3 into VI3, B4:A4 into VI4, and B5:A5 into VI5. The quad-state signal VI5 stored in QSM 2802 and quad-state signal VI4 stored in QSM 2803 is input to QSL AOI gate 2808. The quad-state signal VI3 stored in QSM 2804 and quad-state signal VI2 stored in QSM 2805 is input to QSL OAI gate 2809. The quad-state signal VI1 stored in QSM 2806 and quad-state signal VI0 stored in QSM 2807 is input to QSL AOI gate 2810. The signals output from QSL gates 2808–2810 are input to OR gate 2717. The Boolean logic operations performed by each of the gates in 2801 are indicated at the gate outputs.

In comparing circuit 2701 and 2801 the same conclusions can be reached as previously mentioned in regard to the comparison between circuit 2301 and 2401. These conclusions can be summarized as: (1) circuit 2801 requires less memory and logic circuitry than circuit 2701, (2) circuit 2801 requires a less pad connections than circuit 2701 when input comes from a source external of the Integrated circuit, (3) circuit 2801 requires less clock signal routing/loadine, than circuit 2701, (4) circuit 2801 requires less interconnect wiring between circuit elements than circuit 2701, and (5) circuit 2801 requires less operating power than circuit 2701. As mentioned in recard to circuits 2301 and 2401, any number of memories and logic elements may be used in circuits 2701 and 2801, and in various connection arrangements. Circuits 2701 and 2801 could represent a portion of a more significant circuit architecture, such as a digital signal processor (DSP).

OSM with OSL Gate Outputs

Figure 29:
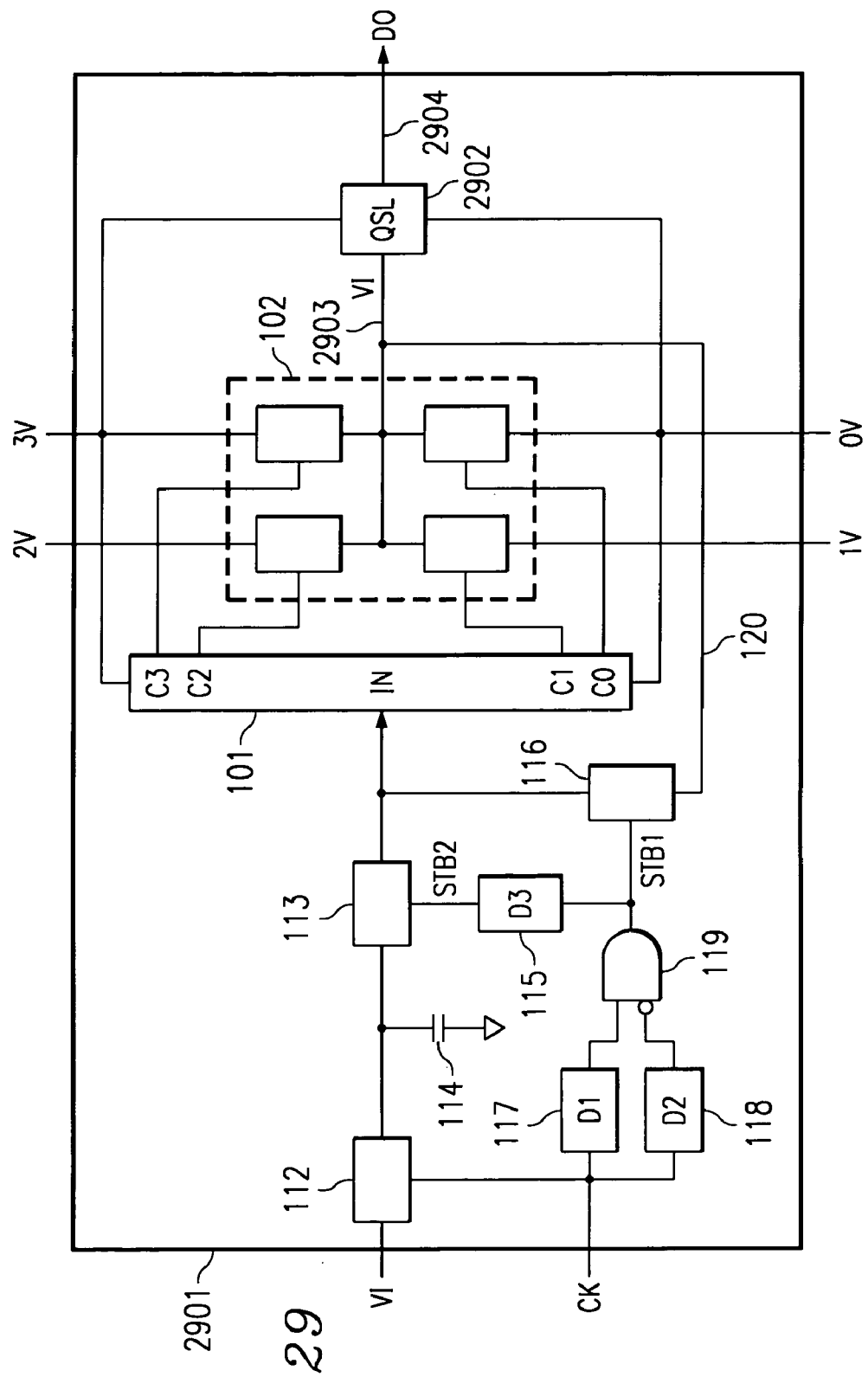
FIG. 29 illustrates a quad-state memory circuit according to another embodiment of the present invention.

In FIG. 29, a QSM 2901 is shown. QSM 2901 is identical to QSM 100 of FIG. 1 with the exception that state output circuit 103 in QSM 100 has been removed in QSM 2901, and a QSL gate 2902 has been added to QSM 2901. The VI input 2903 of QSL gate 2902 is connected to the feedback output 120 of the state feedback circuit 102, and the DO output 2904 of QSL gate 2902 is output from QSM 2901. QSL gate 2902 is connected to the 3V and 0V supplies. QSL gate 2902 is representative of any QSL gate, including all the QSL gates described in regard to FIGS. 5–22 . QSM 2901 advantageously provides a memory capable of: (1) storing a B:A encoded quad-state signal (VI) in response to the CK input, (2) performing a logical operation on the B:A components of the stored encoded signal, and (3) outputting a two-state signal (DO) representative of the logical operation performed.

Figures 26B, 26C, 26D, 26E, 26F, 30:
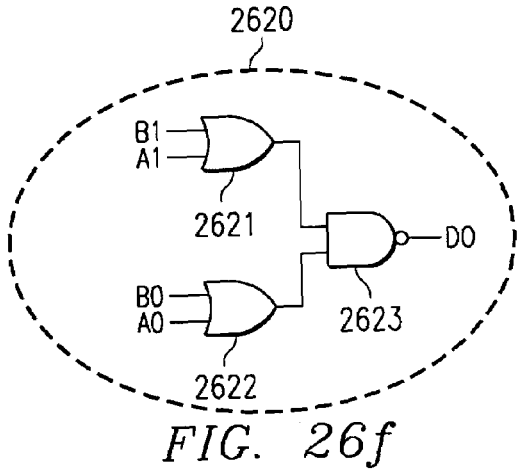

In FIG. 30, a circuit example 3001 using QSMs 2901 is shown. The circuit example includes a quad-state signal source 3002, QSMs 2901 3003–3005, and a two-state signal destination 3007. Connections are formed between quad-state signal source 3002, QSMs 3003–3005, and two-state signal destination 3007 as shown in FIG. 30. During each clock input to QSMs 3003–3005, quad-state signals VI0–VI2 from quad-state signal source 3002 are stored into QSMs 3003–3005. Logical operations are then performed on the B:A components of each of the stored signals via a QSL gate 2902 within each QSM 3003–3005. The results of the logical operations are then output from QSMs 3003–3005 to the two-state signal destination 3007, via the DO0–DO2 connections.

From this example circuit, it can be seen that embedding QSL gate 2902 into the QSM 2901 provides the following advantages. A first advantage is that it provides a higher performance QSM and QSL circuit combination since QSL gate 2902 is connected directly to the output of the state feedback circuit 102, instead of to the VO output of the state output circuit 103. This advantage can be seen by comparing QSM 2901 with the QSM 100 2402 and QSL 901 2405 combination in FIG. 24. In FIG. 24, the VI2 input 2408 of QSM 2402 relates to the VI input of QSM 2901 and the QSL 2405 output 2410 relates to the DO output of QSM 2901. From FIG. 29 it is seen that QSL 2902 is directly connected to state feedback circuit 102 as opposed to being connected to the state output circuit 103, via connection 2409, as is QSL 2405 of FIG. 24. Removing the state output circuit 103 (see FIG. 1) eliminates the signaling delay through the state output circuit 103 and thus the QSM 2901 has a faster clock to DO output transfer than the QSM 2402 and QSL gate 2405 combination in FIG. 24. A second advantage is that it provides a lower circuit overhead QSM and QSL gate combination, since the circuit overhead increase of including the QSL gate 2902 into QSM 2901 is offset by the decrease in circuitry overhead by the removal of the state output circuit 103 of 2901. A third advantage is that it provides a QSM which directly performs logical operations on signals from the quad-state domain to the two-state domain, and therefore simplifies circuit desiom since fewer design elements must be assembled and connected together, i.e. the QSM 2402 and QSL 2405 elements of FIG. 24.

QSM with QSL Gate Output and Quad-State Output

Figure 31:
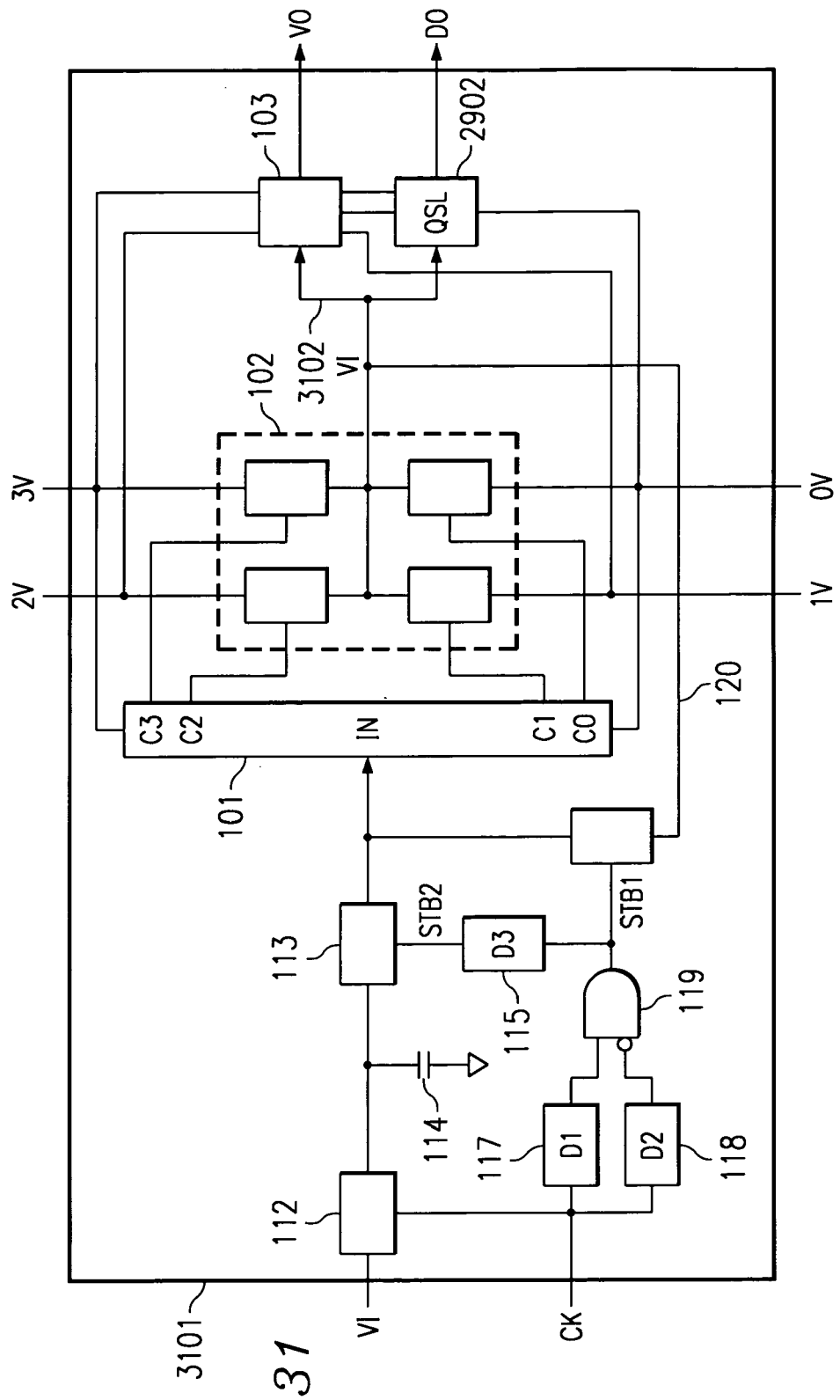
FIG. 31 illustrates a quad-state memory circuit according to another embodiment of the present invention.

In FIG. 31, a QSM 3101 is shown. QSIM 3101 is identical to QSM 2901 of FIG. 29 with the exception that state output circuit 103 is included in QSM 2901 along with the QSL gate 2902. QSM 3101 therefore includes both the VI to VO memory function of QSM 100 in FIG. 1 and the VI to DO logical operation function of QSM 2901 of FIG. 29. The VI inputs of both the state output circuit 103 and QSL 2902 are connected to the feedback output 120 of the state feedback circuit 102 via connection 3102. QSM 3101 differs from QSMs 100 and 2901 in that it has a quad-state signal input (VI) and both a quad-state stanal output (VO) and a two-state signal logical operation output (DO). QSM 3101 advantageously provides a memory capable of: (1) storing a B:A encoded quad-state signal (VI) in response to the CK input, (2) performing a logical operation on the B:A components of the stored encoded signal, (3) outputting a two-state signal (DO) representative of the logical operation performed, and (4) outputting the original B:A encoded quad-state stored via VO.

Figure 32:
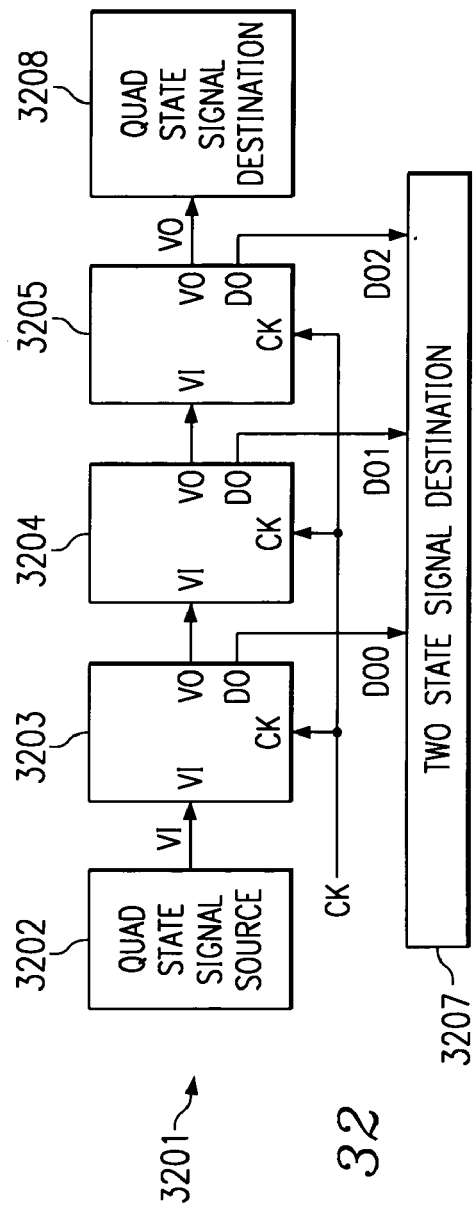
FIG. 32 illustrates a circuit using the quad-state memory circuits of FIG. 31.

In FIG. 32, a circuit example 3201 using QSMs 3101 is shown. The circuit example includes a quad-state signal source 3202, QSMs 3101 3203–3205, a quad state signal destination 3208, and a two-state signal destination 3207. Connections are formed between quad-state signal source 3202, QSMs 3203–3205, quad-state signal destination 3208, and two-state signal destination 3007 as shown in FIG. 32. During each clock input, a quad-state signal is shifted from the quad-state signal source 3202 to QSM 3202, from QSM 3203 to QSM 3204, from QSM 3204 to QSM 3205, and from QSM 3205 to quad-state signal destination 3208. In response to each quad-state signal shift operation, QSMs 3203–3205 each perform a logical operation on the B:A components of the quad-state signal shifted in and output a two-state signal, representative of the logical operation performed, as input to the two-state signal destination 3207, via connections DO0–DO2.

QSM 3101 provides the first and third advantages stated for QSM 2901. An additional advantage unique to the QSMs 3101 3203–3205 of circuit example 3201 is that the QSMs are capable of simultaneously; (1) communicating quad-state signals between quad-state signal source 3202 and destination 3208, (2) performing logical operations on the B:A components of the quad-state signals being communicated, and (3) outputting two-state signal representations of the logical operations performed to two-state signal destination 3207.

The quad-state signal sources of FIGS. 30 and 32 could be any circuit, for example an IC or a subcircuit within an IC, capable of delivering quad-state signal outputs. The quad-state signal destination of FIG. 32 could be any circuit, for example an IC or subcircuit within an IC, capable of receiving quad-state signal inputs. The two-state signal destinations of FIGS. 30 and 32 could be any circuit, for example and IC or a subcircuit within an IC, capable of receiving two-state signal inputs.

Two-State and Quad-State Circuit Examples

Figure 33:
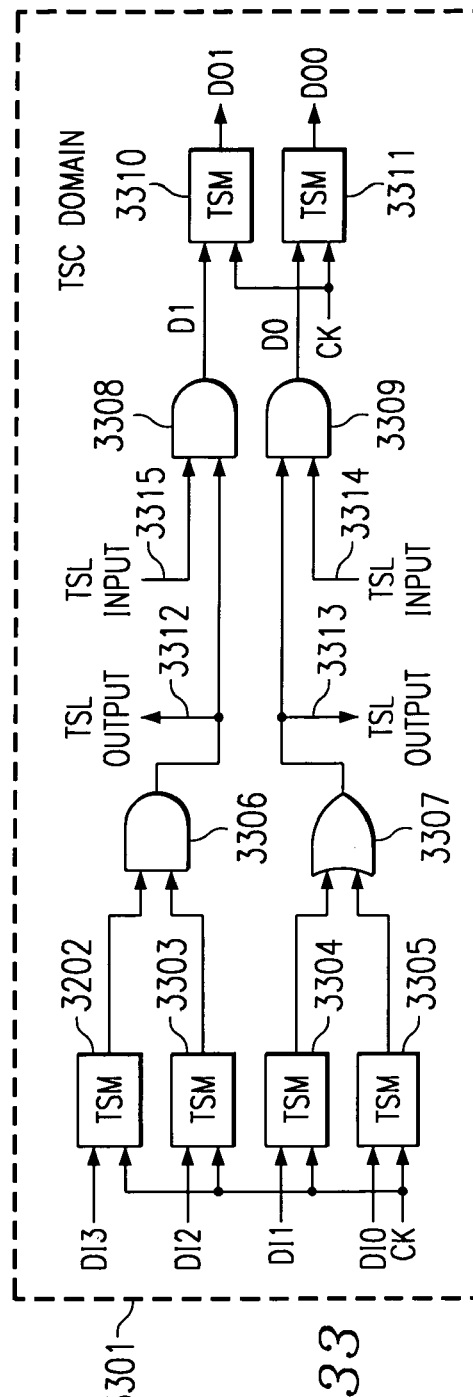
FIG. 33 illustrates a conventional circuit using two-state memory and two-state logic elements to form a two-state circuit domain.

Flaure 33 shows a conventional circuit 3301 consisting of two-state memory (TSM) 3302–3305 3310–3311 and two-state logic (TSL) 3306–3309 elements. The two-state elements are connected together to form a two-state circuit (TSC) domain. The TSC domain has two-state inputs DI0–DI3 to TSM elements 3302–3305 and two-state outputs DO0–DO1 from TSM elements 3310–3311. The two-state inputs come from a two-state signal source and the two-state outputs go to a two-state signal destination. The input and output TSMs are connected together via TSL elements 3306–3309 as shown in FIG. 33. The TSL elements input from and output to additional two-state circuit elements as indicated by TSL connections 3312–3315. While circuit 3301 of FIG. 33 is simple, it may be a small portion of a much larger two-state circuit realizing, for example, a complex digital signal processor or microcomputer architecture existing as an IC or as a IP core embedded within an IC.

FIG. 34 shows how the two-state circuit 3301 may be adapted into a hybrid circuit 3401 consisting of TSC domain 3410 and QSC domains 3411–3412. Circuit 3401 maintains the functionality of the original circuit 3301. The circuit adaptation process involves; (1) replacing TSMs 3302 and 3303 with QSM 100 3402, (2) replacing TSMs 3304 and 3305 with QSM 100 3403, (3) replacing TSL AND gate 3306 with QSL AND gate 901 3404, (4) replacing TSL OR gate 3307 with QSL OR gate 1701 3405, (5) replacing TSMs 3310 and 3311 with QSM 100 3406, and (6) inserting a C-gate 400 3407 between TSL gates 3308 and 3309 and QSM 3406. QSMs 3402–3403 receive VI1 and VI0 input, respectively, from a quad state signal source, and QSM 3406 sends VO0 output to a quad-state signal destination. The combination of QSM 3402 and QSL 3404 provide the circuit function of TSMs 3302–3303 and TSL 3306. The combination of QSM 3403 and QSL 3405 provide the function of TSMs 3304–3305 and TSL 3307. The combination of C-gate 3407 and QSM 3406 provide the circuit function of TSMs 3310–3311. The TSC domain 3410, consisting of TSL gates 3308–3309 and connections 3312–3315 to other TSC elements, remains functionally the same as in the original circuit 3301, with the exception that the TSC domain 3410 inputs from the QSL elements 3404–3405 of the QSC domain 3411 and outputs to C-gate 3407 of the QSC domain 3412. In FIG. 34 it is seen that QSL gates 3404 and 3405 form the partition between the QSC domain 3411 and TSC domain 3410, and C-gate 3407 forms the partition between the TSC domain 3410 and QSC domain 3412.

The improvements of circuit 3401 over circuit 3301 include; (1) a reduction in the number of circuit input connections, i.e. the VI0–VI1 connections replace the DI0–DI4 connections, (2) a reduction in the number of circuit output connections, i.e. the VO0 connection replaces the DO0–DO1 connections, and (3) a reduction in connections between circuit elements, for example (a) a single connection between QSM 3402 and QSL 3404 replaces two connections, i.e. the connections between TSM 3302 and 3306 and TSM 3303 and QSL 3306, and (b) a single connection between QSM 3403 and QSL 3405 replaces two connections, i.e. the connections between TSM 3304 and 3307 and TSM 3305 and QSL 3307. The same reduction in input output, and element to element connections of this small circuit adaptation example can be achieved when much larger circuits are similarly adapted as described above.

In FIG. 35 a circuit 3501 is illustrated showing how QSMs (2901 or 3101) 3502 and 3503 could be used to replace the QSM 3402 and QSL AND gate 3404 combination and the QSM 3403 and QSL OR gate 3405 combination, respectively, of circuit 3401. Other than the replacement of the QSM 3402 and QSL 3404 combination with QSM 3502 and the QSM 3403 and 3405 combination with QSM 3503, circuit 3501 is similar to circuit 3401. The advantages of using QSMs 3502 and 3503 in circuit 3501 over using the separate QSM and QSL element combinations in circuit 3401 are; (1) a further reduction in circuit element interconnect since the QSL AND gate 3404 and QSL OR gate 3405 functions are an integrated as part of QSM 3502 and QSM 3503 respectively (see QSL 2902 of FIGS. 29 and 31), and (2) an improvement in circuit performance since QSMs 3502 and 3503 drive their embedded QSL gates 2902 directly from the state feedback circuit 102, as previously described in regard to FIGS. 29 and 30. In FIG. 35 it is seen that the embedded QSL AND and OR gates of QSMs 3502 and 3503, respectively, form the partition between the QSC domain 3511 and TSC domain 3510.

Quad-State Signaling Power Reduction

Figure 36:
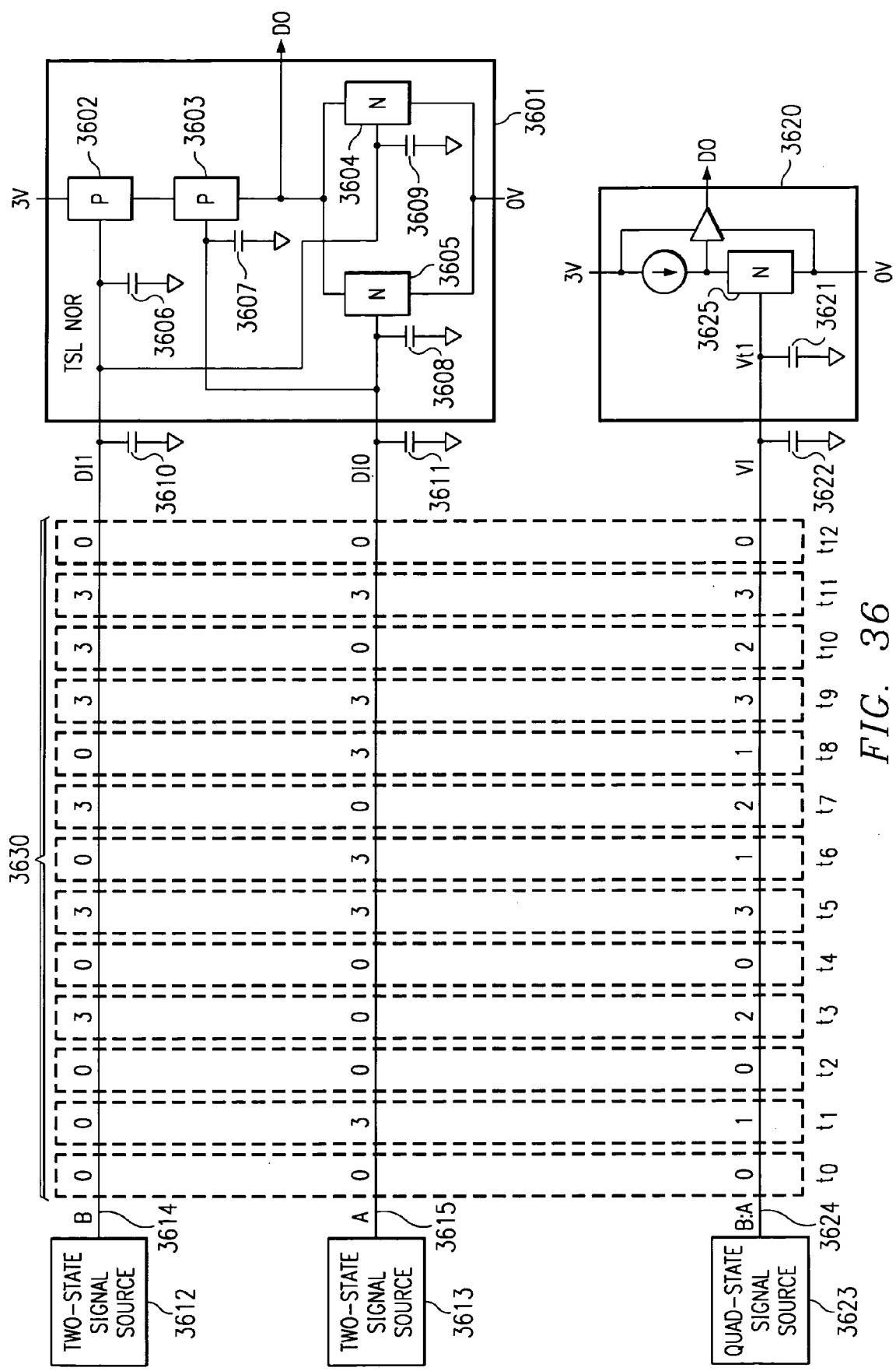
FIG. 36 illustrates an example of signal communication using two-state and quad-state circuits according to the present invention.

FIG. 36 illustrates an example of signal communication using two-state and quad-state circuits. For the purpose of description, the circuits are assumed to be connected to 3V and 0V supply voltages. However, any appropriate higher and lower voltage supplies could be used as well. The two-state signaling circuit consist of two-state signal sources 3612 and 3613 which outputs B and A signals respectively, two-state NOR gate 3601 which inputs the B and A signals at its DI1 and DI0 inputs respectively, and two connections 3614 and 3615 formed between the two-state signal sources 3612–3613 and NOR gate 3601. Capacitor symbol 3610 indicates the capacitance associated with connection 3614, capacitor symbol 3611 indicates the capacitance associated with connection 3615, capacitor symbols 3607 and 3608 indicate the transistor (3603 3605) gate capacitances associated with the NOR gate input (DI0) coupled to connection 3615, and capacitor symbols 3606 and 3609 indicate the transistor (3602 3604) gate capacitances associated with the NOR gate input (DI1) coupled to connection 3614. Capacitances 3610, 3606, and 3609 are charged and discharged by the B signals driven from two-state signal source 3612, and capacitances 3611, 3607, and 3608 are charged and discharged by the A signals driven from two-state signal source 3613.

As seen in the time frame segments ($t_0$–$t_{12}$) 3630, the B and A signals are driven to 0V when a logic low is transmitted and to 3V when a logic high is transmitted. This follows the conventional positive logic signal transfer convention where a logic high is communicated with the highest of two voltages and a logic low is communicated with the lesser of two voltages. The time frame segments are assumed to occur in sequence from a first signal pair transfer at $t_0$ (B=0V and A=0V), to a second signal pair transfer at $t_2$ (B=0V and A=3V), and continuing on to a last signal pair transfer at $t_{12}$ (B=0V and A=0V). For the B signal transfer sequence $t_0$–$t_{12}$ the dynamic power (P) can be estimated by $P=CV^2F$, where C is the total capacitance (3610, 3606, 3609) driven by B, V is the B signal voltage transition, and F is the B signal transition frequency. For the A signal transfer sequence $t_0$–$t_{12}$, the dynamic power can be estimated by $P=CV^2F$, where C is the total capacitance (3611, 3607, 3608) driven by A, V is the A signal voltage transition, and F is the A signal transition frequency. The total dynamic power of B and A is the sum of their individual dynamic power.

The quad-state signaling circuit consist of quad-state signal source 3623 which outputs a quad-state B:A encoded signal representation of the individual two-state B and A signals, quad-state NOR gate 1301 3620 which inputs the encoded B:A signals at its VI input, and connection 3624 formed between the quad-state signal source 3623 and NOR gate 3620. Capacitor symbol 3622 indicates the capacitance associated with connection 3624, and capacitor symbol 3621 indicates the transistor (3625) gate capacitance associated with the NOR gate input (VI) coupled 24 to connection 3624. Capacitances 3624 and 3621 are charged and discharged by the encoded B:A signals driven from quad-state signal source 3623.

As seen in the time frame sequence ($t_0$–$t_{12}$) 3630, the quad-state encoded B:A signal is driven to 0V to encode the B=0V and A=0V two-state signal pair state, 1V to encode the B=0V and A=3V two-state signal pair state, 2V to encode the B=3V and A=0V two-state signal pair state, and 3V to encode the B=3V and A=3V two-state signal pair state. In the time frame sequence 3630 it is seen that, even though the quad-state circuit uses only a single signal transferred over a single connection, it communicates the same amount of B and A information as the two-state circuit during, each time frame sequence segment $t_0$–$t_{12}$. For the encoded B:A signal transfer sequence $t_0$–$t_{12}$, the total dynamic power (P) can be estimated by $P=CV^2F$, where C is the total capacitance (3622 and 3621) driven by the B:A signal, V is the B:A signal voltage transition, and F is the B:A signal transition frequency.

A comparison of power consumed per segment to segment transfer between the two-state and quad-state circuits can be understood by noting the voltage transitions on each connection, as indicated below.

On the $t_0$ to $t_1$ segment transfer, connection 3615 experiences a 0V to 3V transition and connection 3624 experiences a 0V to 1V transition.

On the $t_1$ to $t_2$ segment transfer, connection 3615 experiences a 3V to 0V transition and connection 3624 experiences a 1V to 0V transition.

On the t.sub.2 to t.sub.3 segment transfer, connection 3614 experiences a 0V to 3V transition and connection 3624 experiences a 0V to 2V transition.

On the t.sub.3 to t.sub.4 segment transfer, connection 3614 experiences a 3V to 0V transition and connection 3624 experiences a 2V to 0V transition.

On the t4 to t5 segment transfer, connections 3614 and 3615 both experience a 0V to 3V transition and connection 3624 experiences a 0V to 3V transition.

On the t.sub.5 to t.sub.6 segment transfer, connection 3614 experiences a 3V to 0V transition and connection 3624 experiences a 3V to 1V transition.

On the t.sub.6 to t.sub.7 segment transfer, connection 3614 experiences a 0V to 3V transition, connection 3615 experiences a 3V to 0V transition, and connection 3624 experiences a 1V to 2V transition.

On the t.sub.7 to t.sub.8 segment transfer, connection 3614 experiences a 3V to 0V transition, connection 3615 experiences a 0V to 3V transition, and connection 3624 experiences a 2V to 1V transition.

On the t.sub.8 to t.sub.9 segment transfer, connection 3614 experiences a 0V to 3V transition, and connection 3624 experiences a 1V to 3V transition.

On the t.sub.9 to t.sub.10 segment transfer, connection 3615 experiences a 3V to 0V transition, and connection 3624 experiences a 3V to 2V transition.

On the t.sub.10 to t.sub.11 segment transfer, connection 3615 experiences a 0V to 3V transition, and connection 3624 experiences a 2V to 3V transition.

On the t.sub.11 to t.sub.12 segment transfer, connection 3614 experiences a 3V to 0V transition, connection 3615 experiences a 3V to 0V transition, and connection 3624 experiences a 3V to 0V transition.

From the power consumption per segment to segment transition comparison above it is seen that, in most cases, the quad-state signal power consumption is less than the two-state signal power consumption. This is because the voltage transitions on the 3624 connection of the quad-state circuit, that charge and discharge capacitances 3622 and 3621, is less than the voltage transitions on the 3614 and 3615 connections of two-state circuit, which charge and discharge capacitances 3610, 3606, 3609, 3611, 3608, and 3607.

Quad-State Circuits with Voltage Level Shifting Circuits

Figure 37:
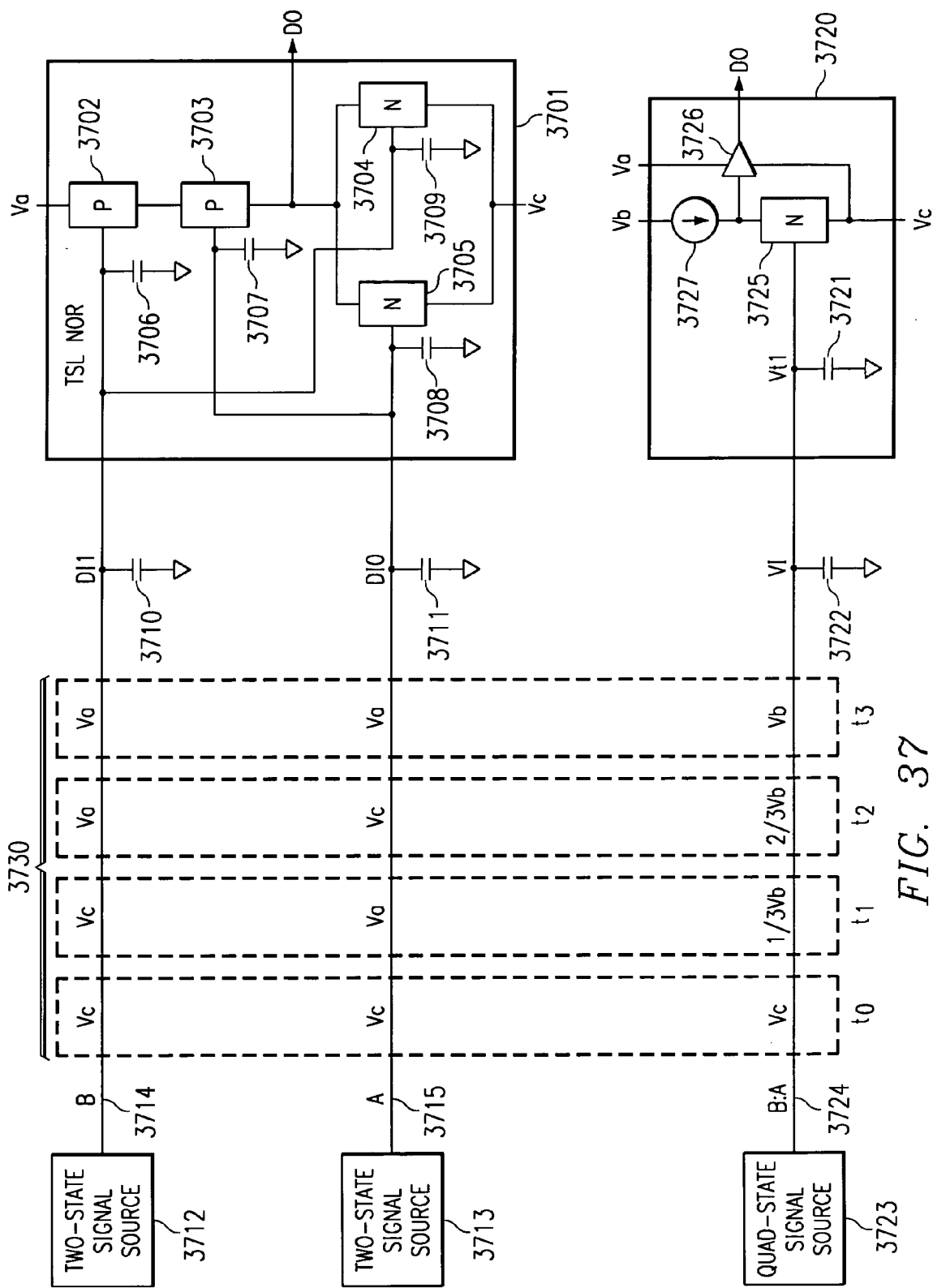
FIG. 37 illustrates an example of signal communication using two-state and quad-state circuits according to another embodiment of the present invention.

FIG. 37 illustrates an example of signal communication using two-state and quad-state circuits that operate from different supply voltages. The two-state signaling circuit consist of two-state signal sources 3712 and 3713 which outputs B and A signals respectively, two-state NOR gate 3701 which inputs the B and A signals at its DI1 and DI0 inputs respectively, and two connections 3714 and 3715 formed between the two-state signal sources and NOR gate. Capacitor symbol 3710 indicates the capacitance associated with connection 3714, capacitor symbol 3711 indicates the capacitance associated with connection 3715, capacitor symbols 3707 and 3708 indicate the transistor (3703 3705) gate capacitances associated with the NOR gate input (DI0) coupled to connection 3715, and capacitor symbols 3706 and 3709 indicate the transistor (3702 3704) gate capacitances associated with the NOR gate input (DI1) coupled to connection 3714. Capacitances 3710, 3706, and 3709 are charged and discharged by the B signals driven from two-state signal source 3712, and capacitances 3711, 3707, and 3708 are charged and discharged by the A signals driven from two-state signal source 3713. Two-state signal sources 3712 3713 and NOR gate 3701 are connected to a positive Va and less positive Vc supply voltage. The voltage difference between Va and Vc may be smaller than the 3V difference shown in FIG. 36 to allow reducing the voltage swing at the inputs and output of NOR gate 3701, to reduce power consumption.

As seen in the time frame segments (t.sub.0–t.sub.3) 3730, the B and A signals are driven to Vc when a logic low is transmitted and to Va when a logic high is transmitted. Again to follow a conventional positive logic convention. The time frame segments are assumed to occur in sequence from a first signal pair transfer at t.sub.0 (B=Vc and A=Vc), to a second signal pair transfer at t.sub.2 (B=VC and A=Va), and continuing on to a last signal pair transfer at t.sub.3 (13=Va and A=Va).

The quad-state signaling circuit consist of quad-state signal source 3723 which outputs a quad-state B:A encoded signal representation of the individual two-state B and A signals, quad-state NOR gate 3720 which inputs the encoded B:A signals at its VI input, and connection 3724 formed between the quad-state signal source 3723 and NOR gate 3720. Capacitor symbol 3722 indicates the capacitance associated with connection 3724, and capacitor symbol 3721 indicates the transistor (3725) gate capacitance associated with the NOR gate input (VI) coupled to connection 3724 Capacitances 3724 and 3721 are charged and discharged by the encoded B:A signals driven from quad-state signal source 3623. Quad-state signal source 3723 and NOR gate 3720 are connected to positive Vb and Va voltages and to a less positive Vc supply voltage. In this example, Vb is a more positive voltage than Va.

As seen in the time frame sequence (t.sub.0–t.sub.3) 3730, the quad-state encoded B:A signal is driven to Vc to encode the B=Vc and A=Vc two-state signal pair state, ⅓Vb to encode the B=Vc and A=Va two-state signal pair state, ⅔Vb to encode the B=Va and A=Vc two-state signal pair state, and Vb to encode the B=Va and A=Va two-state signal pair state.

Quad-state NOR gate 3720 comprises transistor 3725, current source 3727, and voltage level translating output buffer 3726. Transistor 3725 and current source 3727 form a path between the Vb and Vc supplies. The input to buffer 3726 is connected to a node in the path between transistor 3725 and current source 3727 The gate input of transistor 3725 is connected to a VI input and the output of buffer 3726 is connected to a DO output. When the voltage on VI is less than Vt1 (i.e. when VI=Vc), transistor 3720 is off and no current flows in the path, creating a voltage at the buffer 3726 input that drives Va onto the DO output. When the voltage on VI is greater than Vt1 (i.e. when VI={fraction (⅓)}Vb, ⅔Vb, or Vb), transistor 3725 is on and current flows in the path, creating a voltage at the buffer 3726 input that drives Vc onto the DO output. The quad-state NOR gate 3720 differs from the quad-state NOR gate 1301 3620 of FIG. 36 in that it has been designed to input quad-state voltages Vc, ⅓Vb, {fraction (⅔)}Vb, and Vb, and output corresponding two-state voltages Vc and Va from a voltage translating buffer 3726. Other than the voltage output translation the logical operation of NOR gate 3720 is the same as NOR gate 3620. The Va and Vc output voltage swings of buffer 3726 enable quad-state NOR gate 3720 to safety drive inputs to low voltage two-state circuit elements which are connected between Va and Vc supplies, such as the two-state NOR gate 3701, to achieve the low power operation mode previously mentioned.

The use of two-state output level shifting circuits, like buffer 3726 of NOR gate 3720, could be used on any quad-state circuit that needs to output reduced voltage swing signals to low voltage two-state circuitry. For example, QSLs 2902 of QSMs 2901 and 3101 could incorporate level shifting circuitry on the DO output 2904, QSL gates of FIGS. 5–22 could incorporate level shifting circuitry on their DO outputs, and D-gate of FIG. 3 could incorporate level shifting circuitry on its DO1/B and DO0/A outputs. Similarly, the use of two-state input level shifting circuits could be used on all quad-state circuits that need to input reduced voltage swing two-state signals. For example, selector circuit 401 of C-gate 400 of FIG. 4 could incorporate level shifting circuitry on its DI1/B and DI0/A inputs to allow it to receive reduced voltage swing inputs from low voltage two-state circuitry, compress the inputs into quad-state signals, and output the quad-state signals using preferred quad-state voltage levels.

Quad-State and Two-State Circuit Voltage Domains

Figure 38:
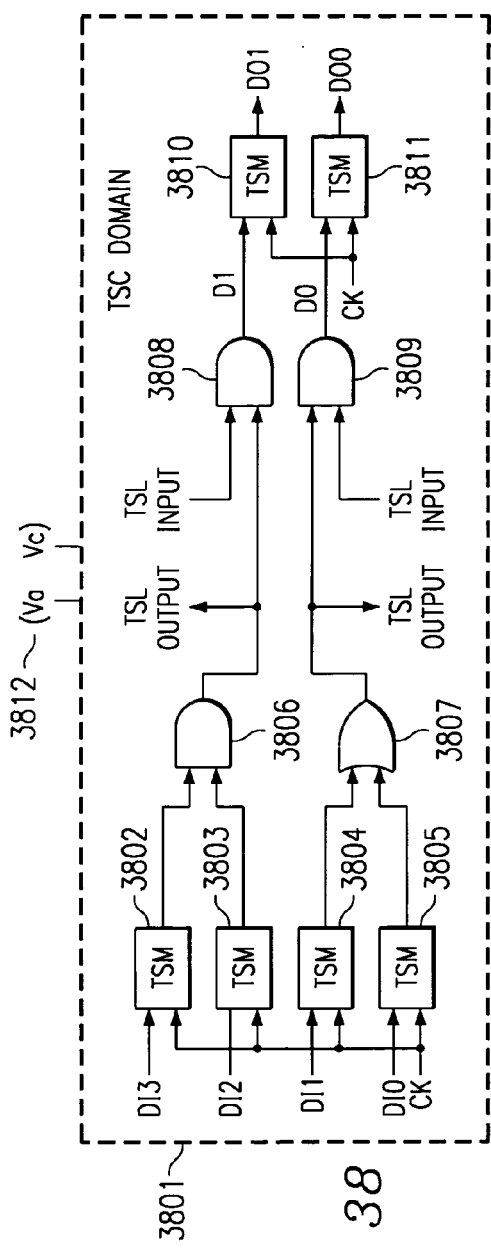
FIG. 38 illustrates a two-state circuit domain.
Figure 39:
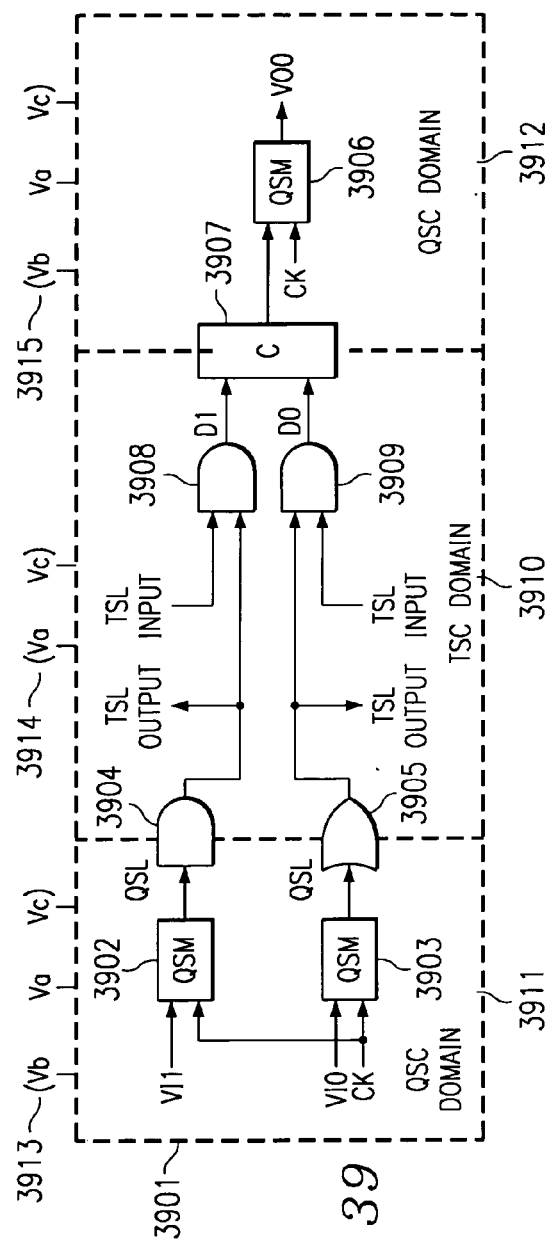
FIG. 39 illustrates a hybrid circuit according to the present invention.

FIG. 38 illustrates a two-state circuit 3801 domain operating between positive Va and less positive Vc supply voltages 3812. Circuit 3801 could represent a low voltage, low power two-state circuit within an IC. Except for the different voltage supplies 3812, circuit 3801 operates as previously described in regard to circuit 3301 of FIG. 33. FIG. 39 illustrates a hybrid circuit 3901 consisting of quad-state circuit domains 3411–3412 and two-state circuit domain 3410. The two-state circuit domain operates between positive Va and less positive Vc supply voltages 3914. The quad-state circuit domains operates between positive Vb and Va and less positive Vc supply voltages 3913 3915. Vb is more positive than Va. QSMs 3902, 3903, and 3906 operate from the Vb and Vc voltages, i.e. the QSMs input and output quad-state signals that switch between Vc, ⅓Vb, ⅔Vb, and Vb Quad-state Vc, ⅓Vb, ⅔Vb, and Vb signals were shown and described in FIG. 37. QSL AND and OR gates 3904 and 3905 operate from the Vb, Va, and Vc voltage supplies, i.e. they input quad-state signals that switch between Vc, ⅓Vb, ⅔Vb, and Vb and output two-state signals that switch between Va and Vc, as described in regard to QSL NOR gate 3720. The C-gate 3907 also operates from Vb, Va, and Vc voltage supplies. The two-state inputs to C-gate are designed with level shifting circuits to allow the C-gate to input two-state signals from two-state gates 3908 and 3909 that switch between Va and Vc. The quad-state outputs from C-gate 3907 to QSM 3906 switch between Vc, ⅓Vb, ⅔Vb, and Vb. Circuit 3901 illustrates how quad-state circuit domains 3911 and 3912, operating from supply voltages 3913 and 3915, may be design to interface with low voltage two-state circuit domains 3910, operating from supply voltages 3914, using level translating circuits at the inputs and outputs of the quad-state circuit domains 3912 and 3911, respectively. Except for the different voltage supplies 3913, 3914, 3915 and level translating circuitry, circuit 3901 operates as previously described in regard to circuit 3401 of FIG. 34.

FIG. 40 illustrates how QSMs 4002 and 4003 with embedded QSL AND and OR gates in quad-state circuit domain 4011 could substitute for the QSM and QSL gate combinations 3902 and 3904, and 3903 and 3905 of quad-state circuit domain 3911. QSMs 4002 and 4003 operate from the Vb, Va, and Vc voltage supplies 4013, i.e. they input quad-state signals that switch between Vc, ⅓Vb, ⅔Vb, and Vb and output two-state signals to the low voltage two-state domain 4010 that switch between Va and Vc. Except for the substitution of QSMs 4002 and 4003, circuit 4001 operates as described in regard to circuit 3901.

3-State Output QSL Circuit

QSL NAND gate 4101 of FIG. 41 illustrates how the QSL NAND gate 501 of FIG. 5 is adapted to include a 3-state condition at its DO 4105 output. The adaptation comprises replacing two-state output buffer 504 of QSL gate 501 with a 3-state output buffer 4104 in QSL gate 4101, and providing an enable (EN) input to the 3-state buffer 4104 to regulate its output to be enabled or disabled. The EN input is driven from a two-state signal source, such as 3612 of FIG. 36. The operation of transistor 4103 and current source 4102 of QSL 4101 remains the same as previously described in regard to transistor 503 and current source 502 of QSL gate 501.

Truth table 4110 depicts the logical operation of 3-state output QSL NAND gate 4101. From truth table 4110, it is seen that QSL NAND gate 4101 duplicates the logical operation of conventional 3-state output TSL NAND 4120 in that: (1) when EN is low, DO is disabled into a high impedance (Z) state, (2) when EN is high and VI is 0V (B:A=L:L), DO is high, (3) when EN is high and VI is 1V (B:A=L:H), DO is high, (4) when EN is high and VI is 2V (B:A=H:L), DO is high, and (5) when EN is high and VI is 3V (B:A=H:H), DO is low. Thus when the EN input is high, the DO output of QSL NAND gate 4101 is enabled to output the results of the NAND logic operation performed on the encoded B and A components of the VI input, but is disabled from outputting the results when the EN input is low.

The advantage of providing 3-state output QSL gates is that is allows connecting the outputs 11 of multiple QSL gates together to allow QSL circuits to communicate over shared bus wiring. For example, a plurality of QSL NAND gates 4101 may have their DO outputs 4105 connected to a common wire, with each being separately enabled by their EN input to output onto the common wire. While a QSL NAND gate was shown and described in FIG. 41 as having a 3-state output capability, any quad-state circuit, such as QSL gates of FIGS. 5–22, D-gate 300 of FIG. 3, AOI gate 2501 of FIG. 25, OAI gate 2601 of FIG. 26, QSM 2901 of FIG. 29, and QSM 3101 of FIG. 31, could be similarly adapted to include 3-state output circuitry and an EN input to provide a 3-state output capability as well.

While 3V and 0V were used as upper and lower voltage supplies for the quad-state circuits described herein, any appropriate upper and lower voltage supplies could have been used. as well. Also, while the quad-state signals were shown as transitioning between 0V, 1V, 2V, and 3V, other voltage level transitions could have been used by the quad-state signals. Further, while the gate threshold voltages Vt1 (0.5V), Vt2 (1.5V), and Vt3 (2.5V) were established to operate with the quad state signal voltage levels used, other gate threshold voltages could have been established to operate with other quad-state signal voltage levels as well.

Although the present invention has been described in accordance to the embodiments shown in the figures, one of ordinary skill in the art will recognize there could be variations to these embodiments and those variations should be within the spirit and scope of the present invention. Accordingly, many modifications may be made by one ordinarily skilled in the art without departing from the spirit and scope of the appended claims.

What is claimed is:

1. A quad state memory comprising:

A. a voltage input;

B. a voltage output;

C. a clock input;

D. four voltage supply inputs of different voltages;

E. a voltage to state converter having supply inputs connected to the four voltage supply inputs and having an voltage input, the voltage to state converter having four state outputs;

F. state feedback circuitry having four state inputs connected to the four state outputs, having four supply inputs connected to the four voltage supply inputs, and having a voltage input;
G. state output circuitry having four state inputs connected to the four state outputs, four supply inputs connected to the four voltage supply inputs, and an output connected to the voltage output;
H. transmission circuitry having an input connected to the voltage input, and having outputs connected to the voltage to state converter and to the voltage input of the state feedback circuitry; and
I. clock circuitry having an input connected to the clock input and having outputs connected to the voltage input transmission circuitry.

2. The memory of claim 1 in which the four voltage supply inputs respectively carry 0 volts, 1 volt, 2 volts, and 3 volts.

3. The memory of claim 1 in which the transmission circuitry includes a strobe input connected to the clock input.

* * * * *